(12) United States Patent
Schoormans et al.

(10) Patent No.: US 10,747,120 B2
(45) Date of Patent: *Aug. 18, 2020

(54) LITHOGRAPHIC METHOD AND APPARATUS

(71) Applicant: ASML NETHERLANDS B.V., Veldhoven (NL)

(72) Inventors: Carolus Johannes Catharina Schoormans, Hooge Mierde (NL); Petrus Franciscus Van Gils, Rijen (NL); Johannes Jacobus Matheus Baselmans, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/558,265

(22) Filed: Sep. 2, 2019

(65) Prior Publication Data

US 2020/0004163 A1    Jan. 2, 2020

Related U.S. Application Data

(63) Continuation of application No. 15/778,093, filed as application No. PCT/EP2016/076477 on Nov. 3, 2016, now Pat. No. 10,401,735.

(30) Foreign Application Priority Data

Nov. 30, 2015  (EP) .................................... 15197050

(51) Int. Cl.
*G03F 7/20* (2006.01)
*G03F 1/42* (2012.01)
*G03F 9/00* (2006.01)

(52) U.S. Cl.
CPC ............ *G03F 7/70516* (2013.01); *G03F 1/42* (2013.01); *G03F 7/70725* (2013.01);
(Continued)

(58) Field of Classification Search
CPC ..... G03F 9/7019; G03F 9/7049; G03F 9/7088
See application file for complete search history.

(56) References Cited

U.S. PATENT DOCUMENTS 4,991,962 A   2/1991  Jain
5,917,604 A   6/1999  Dirksen et al.
(Continued)

FOREIGN PATENT DOCUMENTS

EP   0445871 A1   9/1991
EP   2131243 A2   12/2009
(Continued)

OTHER PUBLICATIONS

PCT/EP2016/076477 International Search Report dated Feb. 9, 2017.

*Primary Examiner* — Steven Whitesell Gordon
(74) *Attorney, Agent, or Firm* — Sterne, Kessler, Goldstein & Fox P.L.L.C.

(57) ABSTRACT

A measurement method comprising using multiple radiation poles to illuminate a diffraction grating on a mask at a mask side of a projection system of a lithographic apparatus, coupling at least two different resulting diffraction orders per illumination pole through the projection system, using the projection system to project the diffraction orders onto a grating on a wafer such that a pair of combination diffraction orders is formed by diffraction of the diffraction orders, coupling the combination diffraction orders back through the projection system to detectors configured to measure the intensity of the combination diffraction orders, and using the measured intensity of the combination diffraction orders to measure the position of the wafer grating.

19 Claims, 15 Drawing Sheets

(52) U.S. Cl.
CPC ........ *G03F 7/70775* (2013.01); *G03F 9/7019* (2013.01); *G03F 9/7049* (2013.01); *G03F 9/7088* (2013.01)

(56) References Cited

U.S. PATENT DOCUMENTS

| | | |
|---|---|---|
| 9,989,864 B2 | 6/2018 | Baselmans et al. |
| 10,401,735 B2 * | 9/2019 | Schoormans ............. G03F 1/42 |
| 2006/0033916 A1 | 2/2006 | Sugihara et al. |
| 2010/0020330 A1 | 1/2010 | Owen |
| 2010/0123887 A1 | 5/2010 | De Winter et al. |
| 2012/0123581 A1 * | 5/2012 | Smilde ................ G03F 7/70483 700/105 |

FOREIGN PATENT DOCUMENTS

| | | |
|---|---|---|
| JP | S63140527 A | 6/1988 |
| JP | H0269603 A | 3/1990 |
| JP | H04348018 A | 12/1992 |
| JP | H08186069 A | 7/1996 |
| JP | 2001135559 A | 5/2001 |
| JP | 2005217092 A | 8/2005 |
| JP | 2015090872 A | 5/2015 |
| WO | 2016008656 A1 | 1/2016 |

* cited by examiner

LITHOGRAPHIC METHOD AND APPARATUS

CROSS-REFERENCE TO RELATED APPLICATIONS

This application is a continuation of U.S. patent application Ser. No. 15/778,093, filed May 22, 2018, which claims priority to U.S. National Stage Application of International Patent Application No. PCT/EP2016/076477, filed on Nov. 3, 2016 which claims priority of EP application 15197050.6 which was filed on Nov. 30, 2015 both of which are incorporated herein in their entirety by reference.

FIELD

The present invention relates to a lithographic method and apparatus.

BACKGROUND

A lithographic apparatus is a machine that applies a desired pattern onto a target portion of a substrate (e.g. a wafer). Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a wafer (e.g. a silicon wafer) that has a layer of radiation-sensitive material (resist). In general, a single wafer will contain a network of adjacent target portions that are successively exposed. Known lithographic apparatus include so-called scanners, in which each target portion is irradiated by scanning the pattern through the beam in a given direction (the "scanning"-direction) while synchronously scanning the wafer parallel or anti parallel to this direction.

When projecting an image onto a wafer it is desirable to ensure that a wafer held on a wafer table is correctly positioned to receive the projected image. The wafer table is positioned using a positioning system which has six degrees of freedom (X, Y, Z, $R_X$, $R_Y$, $R_Z$). For any given position of the wafer table an error in each of the six degrees of freedom will be present. A calibration of the positioning system is performed to measure and record these errors. This calibration allows the wafer table to be accurately positioned during subsequent operation of the lithographic apparatus. One known method of calibrating the positioning of the wafer table is to image alignment marks onto a wafer in a closely packed arrangement, and then to develop the imaged alignment marks and measure their positions. This method is very time consuming, and may for example require several hours.

It is desirable to provide, for example, a method which obviates or mitigates one or more of the problems of the prior art, whether identified herein or elsewhere.

SUMMARY

According to a first aspect of the invention there is provided a method for exposing a wafer in a lithographic apparatus. The method comprises executing at least one calibration measurement during an exposure sequence of a wafer, each calibration measurement comprising: using at least one radiation pole to illuminate a mask side diffraction grating on at least one of a support structure supporting a mask of a projection system and the mask of the lithographic apparatus; coupling at least two different resulting diffraction orders per illumination pole through the projection system; using the projection system to project the diffraction orders onto an object grating on or adjacent an exposure route of a wafer such that a pair of combination diffraction orders is formed by diffraction of the diffraction orders; coupling the combination diffraction orders back through the projection system to a detector system configured to measure an intensity of the combination diffraction orders; and using the measured intensity of the combination diffraction orders to measure a position of the object grating.

In this way, accurate and efficient calibration measurements may be carried out during an exposure operation of a lithographic apparatus with minimal detriment to the throughput of the lithographic apparatus. It will be appreciated that the exposure sequence of the wafer may include steps carried out prior and subsequent to exposure of any target portions of the wafer, including, for example, pre-positioning of the wafer and positioning subsequent to exposure. The detector system may comprise one or more detectors.

The method may comprise adjusting, responsive to at least one calibration measurement, the exposure route of the wafer and/or the support structure prior to exposing a target portion of the wafer.

At least one calibration measurement may be executed at the beginning of an exposure sequence prior to exposure of any target portions of the wafer.

The object grating may be positioned off the wafer on the wafer table. Alternatively, the object grating may be positioned on the wafer. For example, the object grating may be positioned in a scribe lane between target portions of the wafer. There may be a plurality of object gratings with at least one object grating positioned on the wafer, and at least one object grating positioned on the wafer table outside the wafer.

At least one calibration measurement may be executed following exposure of a target portion of the wafer and prior to exposure of a next exposure sequence.

The method may further comprise adjusting an illumination mode of the radiation beam prior to executing at least one calibration measurement.

The method may further comprise exposing a first target portion of the wafer with a radiation beam having a first illumination mode and adjusting the illumination mode of the radiation beam to provide the multiple radiation poles and performing at least one calibration measurement with the adjusted illumination mode.

The method may further comprise moving the support structure to move the radiation beam from the mask to the diffraction grating on the support structure.

The method may further comprise filtering out at least one unwanted diffraction order generated by the mask side diffraction grating and/or the object grating.

The method may further comprise filtering out unwanted diffraction orders generated by the mask side diffraction grating to transmit only two diffraction orders per illumination pole into the projection system.

The method may further comprise filtering out unwanted diffraction orders generated by the object grating such that only the combination diffraction orders are incident upon the detectors.

The filtering out of unwanted diffraction orders may be performed using walls of a tower which extends from the vicinity of the mask side diffraction grating and away from a field plane of the mask side diffraction grating.

The method may further comprise using openings in the walls of the tower to transmit desired diffraction orders generated by the mask side diffraction grating.

The method may further comprise using reflective outer surfaces of a tower which extends from the vicinity of the mask side diffraction grating and away from a field plane of the mask side diffraction grating to reflect the combination diffraction orders to the detectors whilst filtering out unwanted diffraction orders.

The openings in the walls of the tower and the reflective outer surfaces of the tower may be offset relative to an optical axis.

The method may further comprise using a screen between the mask and the projection system to filter out unwanted diffraction orders generated by the mask side diffraction grating.

The intensity of radiation incident at locations on the screen which correspond with the combination diffraction orders may be measured.

The illumination radiation poles may be offset relative to an optical axis.

The object grating may be one-dimensional and may extend in an object grating direction which is substantially parallel to a scanning direction of the lithographic apparatus, and measurements of the position of the object grating in the object grating direction may be obtained using two radiation poles.

The object grating may be one-dimensional and may extend in an object grating direction which is substantially perpendicular to a scanning direction of the lithographic apparatus, and measurements position of the object grating in that direction may be obtained using two radiation poles.

Two detectors may be used to measure the intensity of the combination diffraction orders, the two detectors being spaced apart in the same direction as the object grating direction.

The mask side diffraction grating may be two-dimensional.

The mask side diffraction grating may extend in a mask side diffraction grating direction which is non-parallel to a scanning direction of the lithographic apparatus.

The object grating may be two-dimensional and may extend across substantially an entire wafer.

The object grating may comprise squares separated by channels, the object grating having a duty cycle which is not one-to-one.

The period of the object grating may correspond with the period of the mask side diffraction grating.

Multiple mask side diffraction gratings may be illuminated simultaneously and resulting signals output from the detectors may be monitored.

The mask side diffraction gratings may be positioned to provide a phase separation of approximately 120 degrees between adjacent mask side diffraction gratings.

Multiple object grating positions may be measured simultaneously, and differences between measured object grating positions may be determined.

The differences between measured object grating positions may be used to generate a map of vectors indicative of wafer positioning errors.

The vectors indicative of wafer positioning errors may characterise the position of the wafer with three positional degrees of freedom and three rotational degrees of freedom.

The wafer positioning error map may be subsequently used to correct wafer positioning errors during lithographic exposure of wafers.

The object grating positions may be measured and wafer positioning errors determined only for wafer positions that will be used during subsequent lithographic exposure of a particular pattern onto wafers.

The object grating position may be measured in a direction substantially in a plane of the wafer and may be measured in a direction substantially perpendicular to a plane of the wafer.

The wafer grating position substantially perpendicular to the plane of the wafer may be obtained by determining the difference between signals output from detectors which detect corresponding combination diffraction orders.

The difference between signals may be determined for signals output from different detectors at the same time.

The difference between signals may be determined for signals output from the same detectors at different times.

Four radiation poles may be used to illuminate the mask diffraction grating and four detectors may be provided, each detector measuring the intensity of a different combination diffraction order.

Two of the detectors may be used to measure radiation intensity at locations separated in a first direction and two of the detectors may be used to measure radiation at locations separated in a second direction, the second direction being substantially perpendicular to the first direction.

There is also described herein a measurement method comprising using multiple radiation poles to illuminate a diffraction grating on a mask at a mask side of a projection system of a lithographic apparatus, coupling at least two different resulting diffraction orders per illumination pole through the projection system, using the projection system to project the diffraction orders onto a grating on a wafer such that a pair of combination diffraction orders is formed by diffraction of the diffraction orders, coupling the combination diffraction orders back through the projection system to detectors configured to measure the intensity of the combination diffraction orders, and using the measured intensity of the combination diffraction orders to measure the position of the wafer grating.

The method advantageously allows wafer grating position to be measured in a manner that is not known in the prior art. This may allow the position of a wafer table to be calibrated in a more time efficient manner than is known from the prior art.

There is also described herein a mask sensor apparatus comprising a substrate provided with a grating, a tower extending from the substrate and having walls which are positioned to filter out unwanted diffraction orders generated by the grating, and detectors positioned to receive diffraction orders reflected by outer surfaces of the tower walls.

The tower may include openings which are offset relative to an optical axis.

The grating, tower and detectors may comprise a module, and a plurality of modules may be provided on the substrate.

There is also described herein a mask sensor apparatus comprising a substrate provided with a grating, a screen separated from the plane of the substrate, the screen including an opening which is positioned to allow transmission of desired diffraction orders generated by the grating, and detectors arranged to receive radiation incident on an opposite side of the screen from the substrate, the detectors being positioned to receive diffraction orders which are incident upon the screen at locations which correspond with diffraction orders desired to be detected.

The opening may include arms which are offset relative to an optical axis.

The grating, screen opening and detectors may comprise a module, and the mask sensor may comprise a plurality of modules.

There is also described herein a wafer provided with a diffraction grating, the diffraction grating being two-dimensional and extending across substantially the entire wafer.

The diffraction grating may comprises squares separated by channels which have a duty cycle which is not one-to-one.

The diffraction grating may include gaps in which other marks are provided.

There is also described herein a measurement method comprising using multiple radiation poles to illuminate a diffraction grating on a first side of projection optics of a lithographic tool, coupling at least two different resulting diffraction orders per illumination pole through the projection optics, using the projection optics to project the diffraction orders onto a grating on an object such that a pair of combination diffraction orders is formed by diffraction of the diffraction orders, coupling the combination diffraction orders back through the projection optics to detectors configured to measure the intensity of the combination diffraction orders, and using the measured intensity of the combination diffraction orders to measure the position of the object grating.

There is also described herein a lithographic tool comprising an illumination system for providing a beam of radiation, a support structure supporting a mask sensor apparatus which comprises a substrate provided with a grating for diffracting the radiation beam, a support structure for holding an object, and projection optics for projecting the diffracted radiation beam onto the object, wherein the mask sensor apparatus further comprises a tower extending from the substrate and having walls which are positioned to filter out unwanted diffraction orders generated by the grating, and detectors positioned to receive diffraction orders reflected by outer surfaces of the tower walls.

There is also described herein a lithographic tool comprising an illumination system for providing a beam of radiation, a support structure supporting a mask sensor apparatus which comprises a substrate provided with a grating for diffracting the radiation beam, a support structure for holding an object, and projection optics for projecting the diffracted radiation beam onto the object, wherein the mask sensor apparatus further comprises a screen separated from the plane of the substrate, the screen including an opening which is positioned to allow transmission of desired diffraction orders generated by the grating, and detectors arranged to receive radiation incident on an opposite side of the screen from the substrate, the detectors being positioned to receive diffraction orders which are incident upon the screen at locations which correspond with diffraction orders desired to be detected.

There is also described herein a measurement method comprising using a radiation pole to illuminate a diffraction grating on a mask at a mask side of a projection system of a lithographic apparatus, coupling at least two different resulting diffraction orders through the projection system, using the projection system to project the diffraction orders onto a grating on a wafer such that a combination diffraction order is formed by diffraction of the diffraction orders, coupling the combination diffraction order back through the projection system to a detector configured to measure the intensity of the combination diffraction order, and using the measured intensity of the combination diffraction order to measure the position of the wafer grating.

There is also described herein a lithographic apparatus comprising an illumination system for providing a beam of radiation, a support structure supporting a mask sensor apparatus which comprises a substrate provided with a grating for diffracting the radiation beam, a substrate table for holding a substrate, and a projection system for projecting the diffracted radiation beam onto a target portion of the substrate, wherein the mask sensor apparatus further comprises a tower extending from the substrate and having walls which are positioned to filter out unwanted diffraction orders generated by the grating, and detectors positioned to receive diffraction orders reflected by outer surfaces of the tower walls.

There is also described herein a lithographic apparatus comprising an illumination system for providing a beam of radiation, a support structure supporting a mask sensor apparatus which comprises a substrate provided with a grating for diffracting the radiation beam, a substrate table for holding a substrate, and a projection system for projecting the diffracted radiation beam onto a target portion of the substrate, wherein the mask sensor apparatus further comprises a screen separated from the plane of the substrate, the screen including an opening which is positioned to allow transmission of desired diffraction orders generated by the grating, and detectors arranged to receive radiation incident on an opposite side of the screen from the substrate, the detectors being positioned to receive diffraction orders which are incident upon the screen at locations which correspond with diffraction orders desired to be detected.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
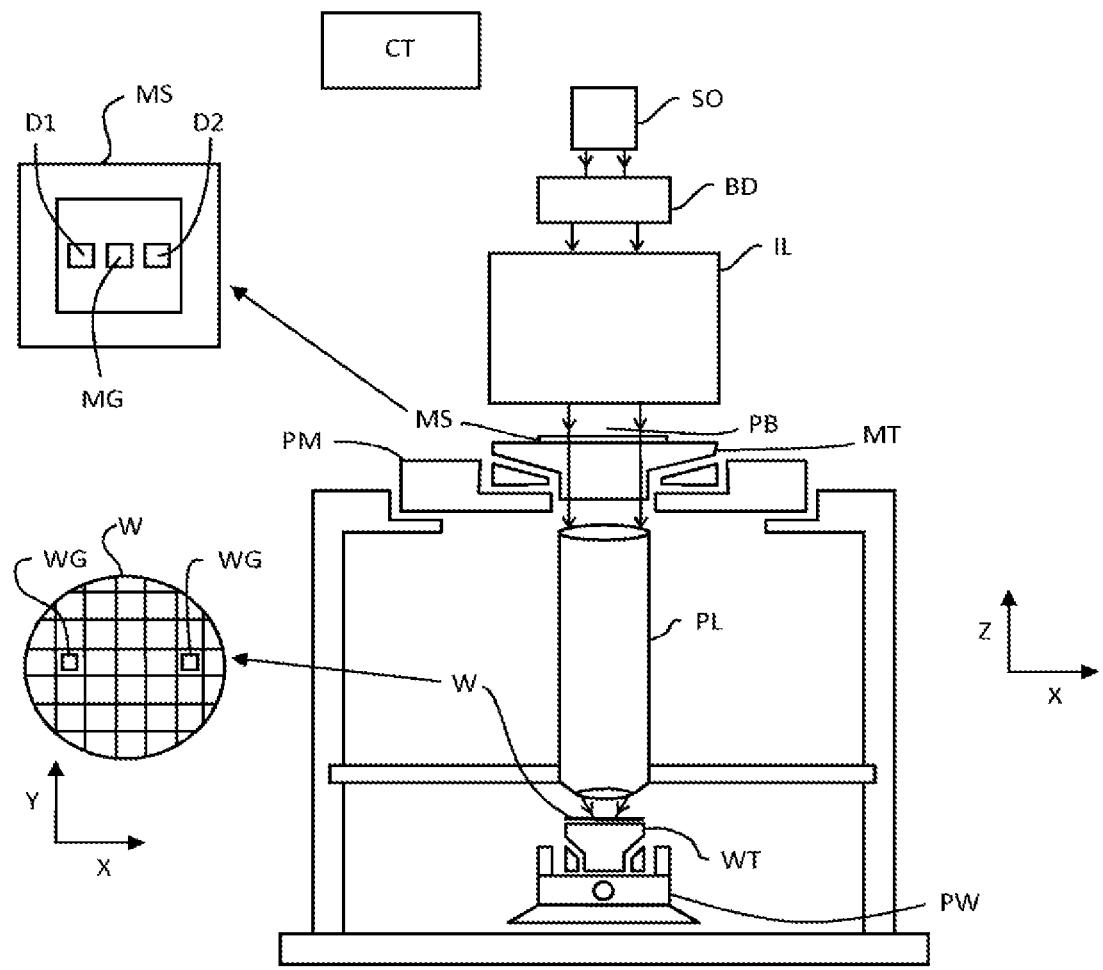
FIG. 1 depicts schematically a lithographic apparatus according to an embodiment of the invention.

FIG. 1 schematically depicts a lithographic apparatus according to a particular embodiment of the invention. The apparatus comprises:

an illumination system (illuminator) IL arranged to condition a beam PB of radiation (e.g. DUV radiation at 193 nm) and generate a desired illumination mode;

a support structure MT which supports a mask sensor apparatus MS, the support structure being connected to first positioning device PM to accurately position the mask sensor apparatus with respect to item PL;

a wafer table WT for holding a wafer W and connected to second positioning device PW for accurately positioning the wafer with respect to item PL; and a projection system (e.g. a series of refractive lenses) PL configured to image a pattern imparted to the radiation beam PB by mask sensor apparatus MS onto the wafer W.

As here depicted, the apparatus is of a transmissive type (e.g. employing a transmissive mask). Alternatively, the apparatus may be of a reflective type (e.g. an EUV lithographic apparatus).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. The source SO and the illuminator IL, together with the beam delivery system BD if required, may be referred to as a radiation system.

The illuminator IL may comprise adjusting means for adjusting the angular intensity distribution of the beam. The adjusting means may be used to adjust the outer and/or inner radial extent (commonly referred to as sigma-outer and sigma-inner, respectively) of the radiation beam in a pupil plane of the illuminator. In addition, the adjusting means may be used to select illumination modes such as a dipole mode, a quadrupole mode, or other mode. The illuminator IL provides a conditioned beam of radiation PB having a desired illumination mode.

The radiation beam PB is incident on the mask sensor apparatus MS which is held by the support structure MT. The mask sensor apparatus comprises a diffraction grating MG which diffracts the radiation beam. The diffracted radiation beam passes through the projection system PL, which focuses the beam onto the wafer W and thereby forms an image of the mask diffraction grating MG. The wafer is provided with an array of diffraction gratings WG (only two of which are schematically illustrated) or with a single diffraction grating which extends across substantially the entire wafer (described further below). A two-dimensional grid plate (not shown) is used to monitor the position of the second positioning device PW. In an alternative arrangement interferometers (not shown) may be used to monitor the position of the second positioning device PW. The second positioning device is used to move the wafer table WT so as to position a wafer diffraction grating WG relative to the image of the mask diffraction grating MG. The wafer diffraction grating WG diffracts the incident radiation. A proportion of this diffracted radiation passes back through the projection system PL and is incident upon detectors D1, D2 which form part of the mask sensor apparatus MS. The detectors D1, D2 provide output signals which can be used to measure the position of the wafer diffraction grating WG in the X and Z directions. More than two detectors may be provided, as described further below. A controller CT controls movement of the substrate table WT. The controller CT may also receive signals output from the detectors D1, D2 and record these as a function of the position substrate table WT as measured by the two-dimensional grid plate (or interferometer). Signals output from the detectors D1, D2 may for example be communicated to the controller CT wirelessly. Alternatively, signals output from the detectors D1, D2 may be retained in a memory which forms part of the mask sensor apparatus MS and may be retrieved from the memory after the mask sensor apparatus MS has been removed from the lithographic apparatus (or transferred to some other part of the lithographic apparatus). In an embodiment, described further below, optical fibres may be located at positions D1, D2 and used to couple incident radiation to remotely located detectors. The signals output from the detectors D1, D2 may be used to measure the position of the wafer W and thereby provide for calibration of the second positioning device PW. A processor may be used to calculate the position of the wafer W using the signals output from the detectors. The processor may for example form part of the controller CT.

Figure 2:
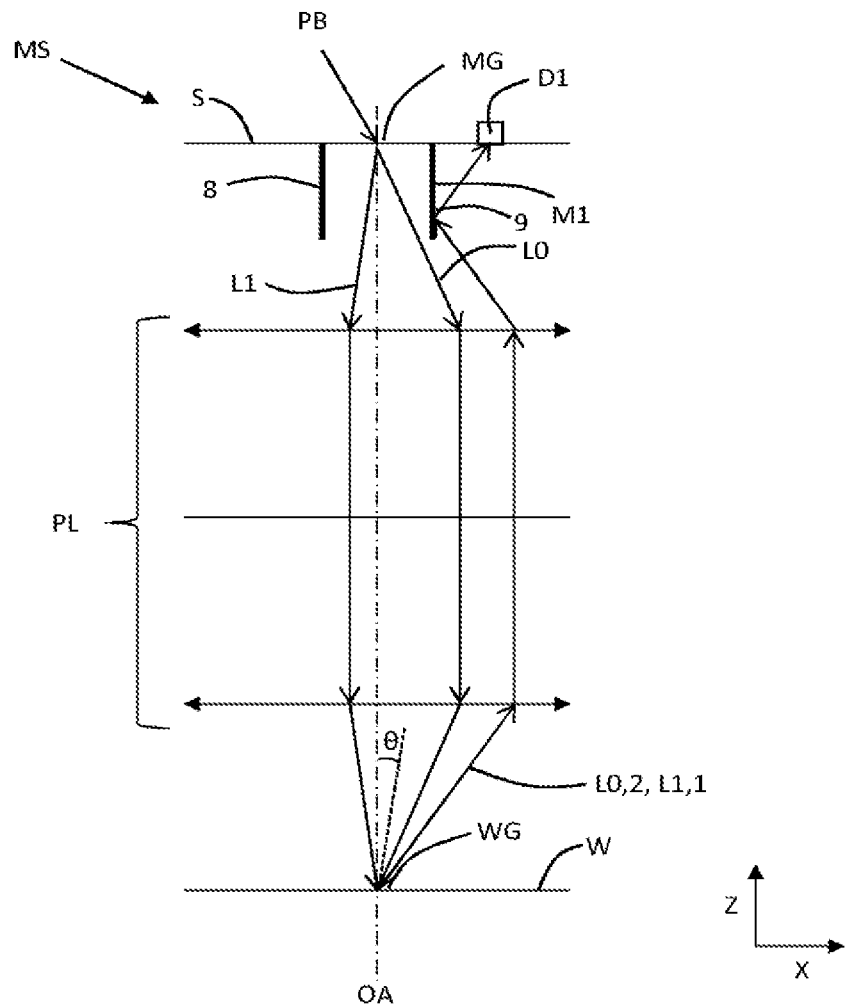
FIG. 2 depicts schematically part of the lithographic apparatus and a measurement method according to an embodiment of the invention.

FIG. 2 illustrates schematically an example of how the mask sensor apparatus may be used to generate a combined diffraction order which, when measured by a detector D1 can be used to determine the position of the wafer diffraction grating WG. The mask sensor apparatus MS comprises a mask substrate S upon which a diffraction grating MG, a detector D1 and a pair of walls 8,9 are provided. The mask sensor apparatus MS is located on the mask side of the projection system PL of the lithographic apparatus (i.e. where a mask would be located during normal operation of the lithographic apparatus). A radiation beam PB is incident on the mask diffraction grating MG. The radiation beam is generated by the source SO (see FIG. 1). Thus, the radiation beam is actinic radiation with a wavelength which corresponds with the wavelength that will be used by the lithographic apparatus to expose wafers during production (e.g. 193 nm). The radiation beam is a dipole (or quadrupole) mode, only one pole of which is shown in FIG. 2 for simplicity. The mask diffraction grating diffracts the radiation beam to form a zero diffraction order L0 and a first diffraction order L1. These two diffraction orders L0, L1 propagate through the projection system PL and are focussed by the projection system onto a wafer W. Other diffraction orders are generated but these are either blocked by the walls 8,9 (the walls act as a filter which filters out unwanted diffraction orders) or fall outside of the numerical aperture of the projection system PL. The wafer W is provided with a diffraction grating WG which diffracts the incident radiation. Although several diffraction orders may be generated only two diffraction orders are illustrated. The first illustrated diffraction order is the second diffraction order of the wafer grating WG generated from the zero order radiation diffracted by the mask grating MG. This is identified with the notation L0,2. The second illustrated diffraction order is the first diffraction order of the wafer grating WG generated from the first order radiation diffracted by the mask grating MG. This is identified with the notation L1,1. These two diffraction orders L0,2, L1,1 co-propagate together (they are collinear). The two diffraction orders L0,2, L1,1 may be referred to as a combination diffraction order (or combination order). The combination order L0,2, L1,1 propagates back through the projection system PL. The combination order L0,2, L1,1 is then incident upon a reflective surface M1 of the wall 9, which directs the combination order to the detector D1. The detector D1 is an intensity detector and measures the intensity of the combination order L0,2, L1,1. Other diffraction orders (including combination orders) may propagate back through the projection system PL, but these other orders are not incident upon the reflective surface M1 of the wall 9 and thus are not incident upon the detector D1. The wall 9 thus again acts as a filter, this time selecting the combination order L0,2, L1,1 and excluding other diffraction orders. The walls 8,9 therefore act as filters twice, once for radiation which has been diffracted from the mask grating MG and once for radiation which has been diffracted from the wafer grating WG.

The intensity of the combination order L0,2, L1,1 depends upon the relative alignment between the wafer grating WG and the aerial image of the mask grating MG formed by the incident diffraction orders L0 and L1. Alignment of bright lines of the mask grating aerial image with reflective portions of the wafer grating will generate a high intensity at the detector D1. Conversely, alignment of dark lines of the mask grating aerial image with reflective portions of the wafer grating will generate a low intensity at the detector D1. Thus, movement of the wafer grating WG (and wafer) in the X-direction will change the relative alignment of bright lines of the mask grating aerial image and reflective portions of the wafer grating, and will cause the intensity of the combination order to vary in a sinusoidal manner. Although grating lines are referred to here the same applies to gratings which are not formed from lines (e.g. gratings which extend in two directions such as checker-board type gratings).

Since the aerial image of the mask grating is formed by two diffraction orders L0, L1 which are not symmetric about the optical axis of the projection system PL, the aerial image is tilted with respect to the optical axis. The angle of tilt of the aerial image bisects the two incident diffraction orders L0, L1 and is denoted in FIG. 2 as θ. Due to the angle of tilt θ of the mask grating aerial image, the relative alignment of bright lines of the aerial image and reflective portions of the wafer grating will vary as a function of the Z-direction position of the wafer grating (i.e. the position of the wafer grating relative to the focal plane of the projection system). Again, although grating lines are referred to here the same applies to gratings which are not formed from lines.

As is explained further below, when multiple detectors are used a movement in the Z-direction will generate signals at the detectors which are different from the signals generated by a movement in the X-direction. This allows discrimination between Z-direction measurements and X-direction measurements.

Figure 3:
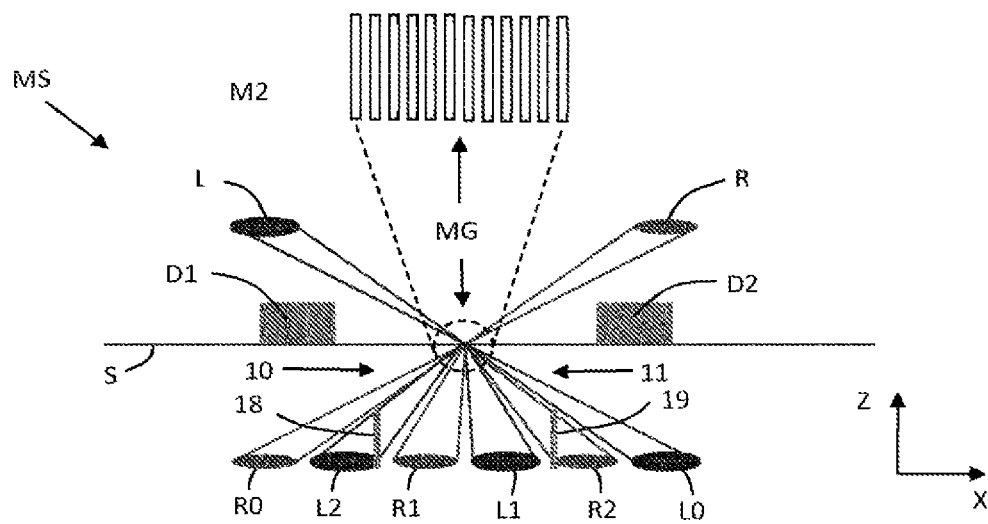
FIGS. 3-5 depict schematically generation and measurement of diffraction orders according to an embodiment of the invention.

A modified arrangement of the mask sensor apparatus MS is shown schematically in FIG. 3. The mask sensor apparatus of FIG. 3 is arranged to transmit and detect different diffraction orders from the mask sensor apparatus of FIG. 2. In common with the embodiment shown in FIG. 2, the mask sensor apparatus MS shown in FIG. 3 comprises a mask substrate S and a diffraction grating MG. Instead of showing a single pole of incident radiation and a single detector, FIG. 3 shows two incident poles L,R and two detectors D1, D2. An expanded view of a mask diffraction grating MG viewed from above is included in FIG. 3. Walls 18, 19 extend below the mask substrate S and include openings 10, 11 which allow passage of radiation between the openings and the mask substrate S. Due to the schematic nature of FIG. 3 and for simplicity of illustration, the manner in which the walls 18, 19 are connected to the mask substrate S is not shown (this is described further below). The mask sensor apparatus MS may be provided with additional components which are omitted here for simplicity of illustration.

The mask sensor apparatus MS is illuminated using a radiation beam which comprises a dipole mode, represented schematically in FIG. 3 by first and second poles L,R. The dipole mode may have a sigma-inner of around 2/3 and a sigma-outer of around 3/3. In other words the dipole mode occupies the outer third of the numerical aperture of the projection system (this may be considered to be a relatively high sigma). The mask diffraction grating MG diffracts this incident radiation into a plurality of diffraction orders. This is schematically depicted in FIG. 2 as zero order L0, first order L1 and second order L2 which are generated from the left hand pole L of the dipole, and zero order R0, first order R1 and second order R2 which are generated from the right hand pole R of the dipole. The walls 18,19 are reflective on their outer surfaces but have inner surfaces which act to block radiation. Thus, the second order diffraction L2, R2 is blocked by the walls 18,19 (the walls 18,19 filter out the second order diffraction). In any event, the second order diffraction L2, R2 has a relatively small amplitude due to the one-to-one duty cycle of the mask diffraction grating MG. Due to the blocking effect of the mirrors M1, M2, only the zero orders L0, R0 and first orders L1, R1 enter the projection system PL of the lithographic apparatus (not shown) and are imaged onto a wafer. Higher diffraction orders (i.e. orders greater than the second order) fall outside the numerical aperture of the projection lens.

Figure 4:
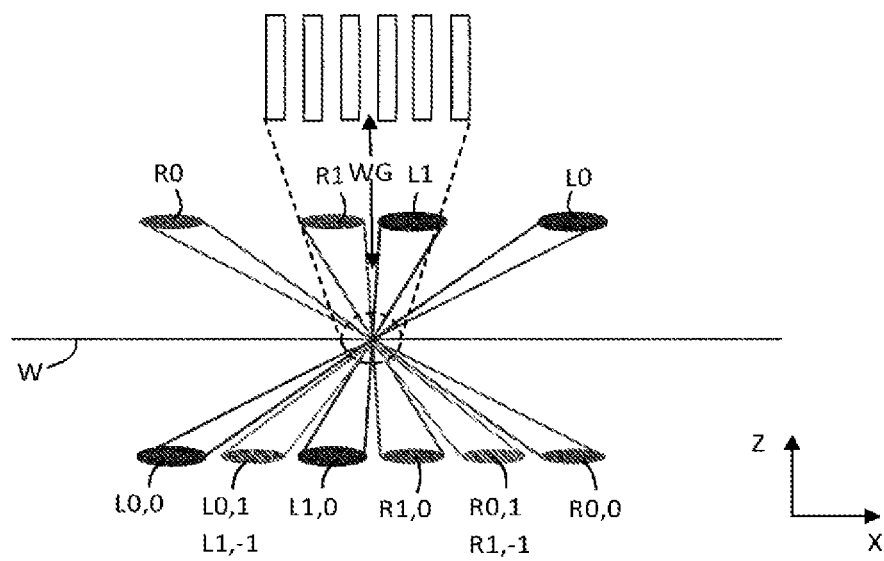

FIG. 4 shows schematically a wafer W upon which the radiation diffracted by the mask grating is incident after passing through the projection system. FIG. 4 also shows radiation which has been diffracted by a diffraction grating WG provided on the wafer. The wafer grating WG is reflective rather than transmissive, but for ease of illustration radiation which has been reflected from the wafer grating is shown beneath the wafer W. Since the wafer grating WG is reflective, the incident radiation undergoes reflection in addition to being diffracted by the wafer grating.

An expanded view of the wafer grating WG viewed from above is included in FIG. 4. The wafer grating WG is symmetrical and has a period which is double the period of the mask grating MG (ignoring the effect of a reduction factor of the projection system PL). The incident radiation comprises zero and first order radiation R0, R1, L0, L1. The wafer grating WG diffracts the incident radiation into several diffraction orders, only some of which are shown in FIG. 4. Dealing first with the zero order incident radiation L0, the first two diffracted orders generated from this radiation are shown. These are the zero order L0,0 and the first order L0,1. The second order will have a low intensity due to the one-to-one duty cycle of the wafer grating WG and is not illustrated. Since the period of the wafer grating WG is twice the period of the mask grating MG, the angular separation between diffraction orders is half that seen for the mask grating.

Turning to the first order incident radiation L1, this is diffracted as a zero order L1,0 and a first order L1,-1. Second order diffraction will also occur but is not shown here because it has a low intensity due to the one-to-one duty cycle of the wafer grating WG. Because the angular separation between diffraction orders is half that seen at the mask, the first diffraction order L0,1 generated from the zero order incident radiation L0 and the first diffraction order L1,-1 generated from the first order incident radiation L1 overlap each other. The first diffraction orders L0,1 and L1,-1 are coherent with each other because they originate from the same source SO and are imaged by the projection system PL (see FIG. 1) which is diffraction limited. Thus, the overlap between the first diffraction orders L0,1 and L1,-1 generates interference. This interference is illustrated schematically by striped shading. The phase of the interference between the first diffraction orders L0,1 and L1,-1 will vary depending upon the position of the wafer grating WG, as is discussed further below. The diffraction orders L0,1 and L1,-1 are collectively be referred to as a combination diffraction order (or combination order).

The other incident radiation R0, R1 is diffracted in the same manner. Thus, the zero order incident radiation R0 is diffracted as a zero order R0,0 and a first order R0,1. The first order incident radiation R1 is diffracted as a zero order R1,0 and a first order R1,-1. The first diffraction orders R0,1 and R1,-1 overlap with each other and thus interfere with each other. The interference is illustrated schematically by striped shading. The phase of the interference between the first diffraction orders R0,1 and R1,-1 will vary depending upon the position of the wafer grating WG. The diffraction orders R0,1 and R1,-1 are collectively be referred to as a combination diffraction order (or combination order).

Figure 5:
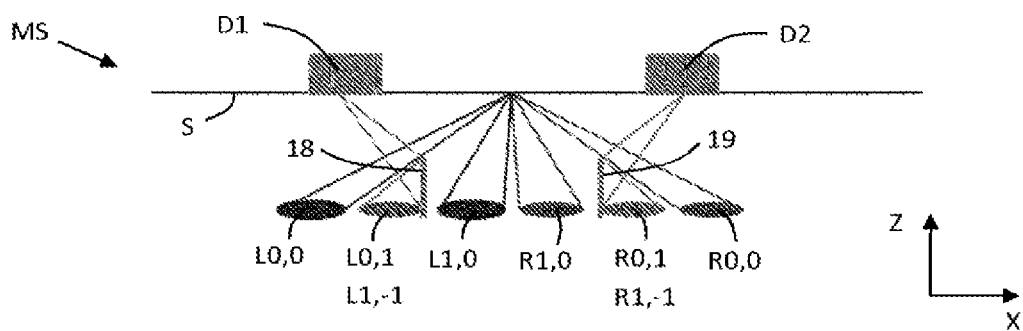

FIG. 5 schematically shows detection by the first detector D1 of the combination order L0,1 and L1,-1, and detection by the second detector D2 of the combination order R0,1 and R1,-1. As is schematically depicted, the walls 18,19 act to reflect only these combination orders to the detectors D1, D2. The reflective walls 18,19 are sized and positioned such that they do not reflect other diffraction orders L0,0, L1,0, R1,0 and R0,0 to the detectors D1, D2 but instead allow these to pass without reflection. Thus, only the combination orders L0,1, L1,-1, R0,1, R1,-1 are incident upon the detectors D1, D2 (other orders are filtered out by the reflective walls 18,19). No optics are needed to focus radiation onto the detectors D1, D2 because the projection system already provides focusing of the radiation. Due to the reflection which occurs at the wafer grating WG, each combination order is detected at the same side as the pole of incident radiation which generated that combination order. Thus, the left hand pole L generates a combination order L0,1, L1,-1 which is detected by the left hand detector D1, and the right hand pole R generates a combination order R0,1, R1,-1 which is detected by the right hand detector.

The detectors D1, D2 are configured to detect the intensity of incident radiation (there is no need for the detectors to be imaging detectors). Since the phase of interference in the combination orders L0, L1, R0, R1 changes as a function of the position of the wafer grating WG, intensity signals output from the detectors D1, D2 may be used to measure the position of the wafer grating.

Movement of the wafer W will change the phase of the interference in the combination order L0,1 and L1,-1 and will also change the phase of the interference in the combination order R0,1 and R1,-1. As is explained further below, movement in the X-direction will cause the phase of interference in the combination orders to change with the same sign, whereas movement in the Z-direction will cause the phase of interference in the combination orders to change with opposite signs.

Another way of considering the same effect is with reference to relative alignment between the wafer grating WG and an aerial image of the mask grating MG. Movement of the wafer grating in the X-direction will cause the relative alignment of the wafer grating and the aerial image of the mask grating to change in the same manner for both detectors D1, D2. However, the aerial image of the mask grating MG generated by each pole L,R is tilted with respect to the optical axis, the tilt of the aerial image generated by the left pole L having an opposite sign from the tilt of the aerial image generated by the right pole R. As a result, movement in the Z-direction of the wafer grating will change the relative alignment between the wafer grating and the mask grating aerial images to change with opposite sign.

Figure 6:
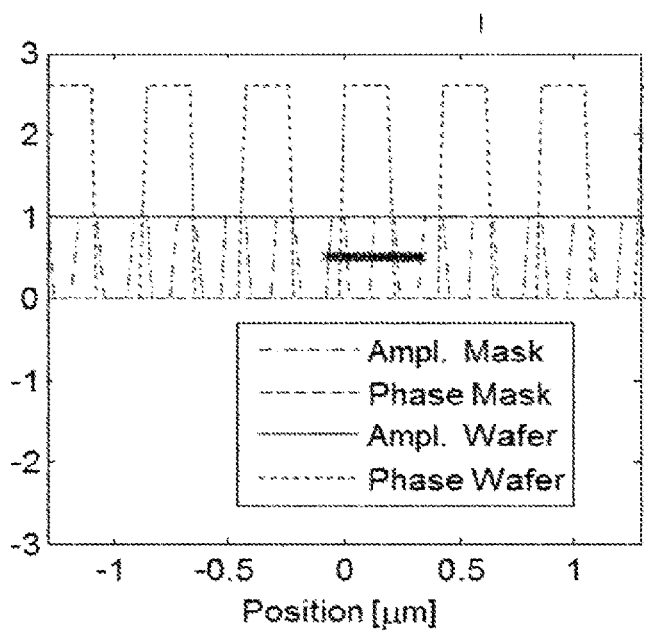
FIG. 6-9 depict results of a simulation the embodiment depicted in FIGS. 3-5.
Figure 7:
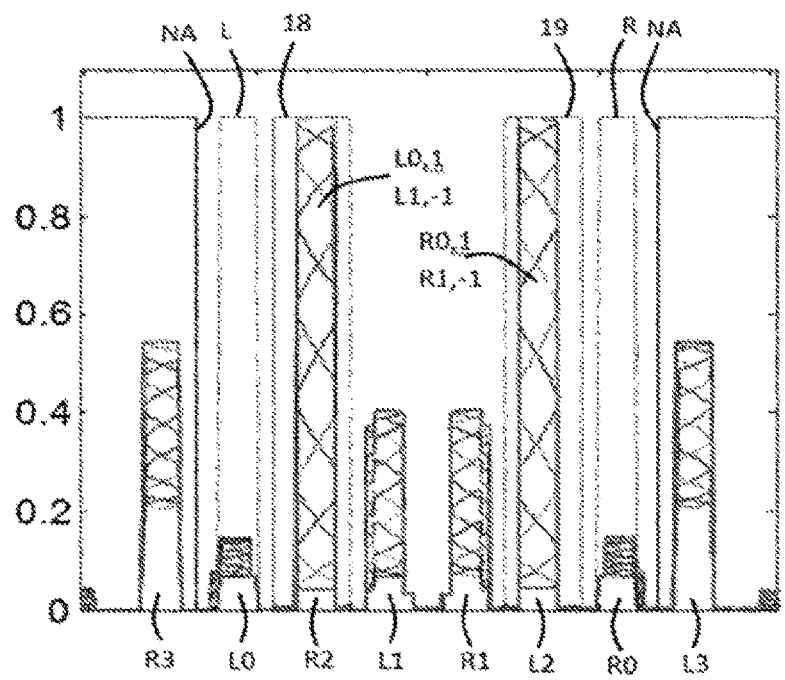

FIGS. 6 and 7 show the results of a simulation of the apparatus and method shown in FIGS. 3-5. FIG. 6 shows the form of the mask diffraction grating and the wafer diffraction grating which were used in the simulation. The mask diffraction grating is a transmissive amplitude grating with a period of 215 nm. This is calculated based on the equation:

$$p = 3\lambda/2/NA$$

wherein p is the period of the grating, $\lambda$ is the wavelength of the radiation beam (in this case 193.3 nm) and NA is the numerical aperture of the projection system (in this case 1.35). The numerical aperture forms part of the calculation used to determine the mask grating period because this is the mechanism by which the number of diffraction orders which are captured by the projection system and used by the method is determined. The period of the mask grating is selected such that three diffraction orders (i.e. 0, 1 and 2) could pass through the projection system where as higher orders (3, 4, etc) do not pass through the projection system. The period of the mask grating is expressed in terms of its equivalent size at wafer level, i.e. as imaged by the projection system onto the wafer (as is conventional). If the reduction factor of the projection system were 4× then the absolute period of the grating in this example would be 860 nm (i.e. as measured at the mask side of the projection system).

Also represented in FIG. 6 is the wafer grating. This is a reflective phase grating and has a period of 430 nm, i.e. double the period of the mask grating. The reflective phase grating is formed in the wafer by etching the grating into the wafer (as explained further below).

The simulation applied a dipole illumination mode at a wavelength of 193 nm to the mask grating and applied the resulting diffracted radiation to the wafer grating. The results of the simulation are shown in FIG. 7. FIG. 7 represents in a pupil plane the incident radiation and resulting diffracted radiation and can be seen to generate an output which corresponds with the output shown in FIG. 5. The incident radiation L, R is indicated by dotted lines. Considering first the left hand incident pole L, the mask grating generates zero order diffraction L0, first order diffraction L1, second order diffraction L2 and third order diffraction L3. The third order diffraction L3 falls outside of the numerical aperture of the projection system (the numerical aperture is identified by solid lines NA). The second diffraction order L2 is blocked by wall 19 (identified by a dotted line). Turning to the right hand pole of the illumination mode, four diffraction orders R0-R3 are generated, the second order being blocked by wall 18 and the third order falling outside of the numerical aperture NA of the projection system.

In FIG. 7 for ease of illustration the swapping over between sides of the diffraction orders upon passing through the mask grating and upon diffraction by the wafer grating is omitted. The zero and first diffraction orders generated from the left hand pole are diffracted such that they form combination order L0,1, L1,-1. Similarly, the zero and first diffracted orders of the right hand pole are diffracted by the wafer grating to form combination order R0,1, R1,-1. The walls 18,19 have an angular extent which corresponds with the combination orders L0,1, L1,-1, R0,1, R1,-1 and thus reflect the combination orders to detectors (whilst filtering out other unwanted orders).

The incident radiation poles L,R are smaller in angular size than the radiation wavelength divided by the period of the mask grating MG. As a result, the diffraction orders which are generated by the mask grating MG are underfilled. In FIG. 7, the combination orders L0,1, L1,-1, R0,1, R1,-1 are underfilled and thus do not extend fully to edges of the walls 18,19. This is advantageous because it allows for some position tolerance between the walls 18,19 and the mask grating MG, whilst ensuring that all the radiation within the combination orders is reflected by the walls to detectors. This allows the intensity of the combination orders to be detected accurately following reflection from the walls 18,19. If a misalignment between the walls 18,19 and the mask grating MG occurs which is greater than the tolerance provided by underfilling of the diffraction orders then this will be apparent from nonlinearities in the signals output from the detectors. The principle of underfilling diffraction orders in order to provide some positional tolerance may be used in connection with any of the embodiments of the invention.

The simulation output shown in FIG. 7 was generated by 'phase stepping' the position in the X-direction of the wafer grating relative to the mask grating. The term 'phase stepping' is intended to mean that movements in the X-direction were made, the movements being sufficiently small that small changes of the phase of radiation intensity in the combination orders can be measured (in this context a small change of phase may be interpreted as meaning a change of phase which is significantly less than a phase period). Measurements were obtained for each phase step over a full period of the wafer grating. Individual measurement positions are indicated by crosses in FIG. 6. In the simulation all phase stepping measurements were obtained within one period of the wafer grating. However, this is not necessarily the case in practice. Phase stepping measurements can be obtained over many periods. (e.g. ten steps with a step size of (0.1+k)p, where k equals any integer and p the period of the wafer grating). In other words, it is not necessary that all measurements are performed over a single period of a grating. Instead, measurements may be spread out over a plurality of periods of the grating (with one or more measurements being performed per period of the grating).

Figure 8:
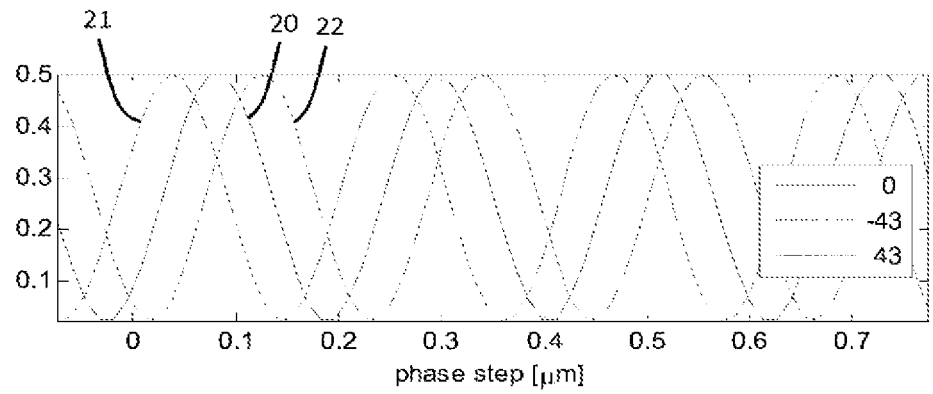

FIG. 8 shows the simulated intensities of the combination orders as a function of relative phase in the X-direction of the mask grating and the wafer grating. The wafer grating was moved in an iterative manner from a nominal initial position and the intensity of the resulting combination order was determined by the simulation. The image of the mask grating at the wafer has a sinusoidal modulation because only two diffraction orders are used to form the image (the zero and first orders). Thus, when the wafer grating is moved beneath the mask grating aerial image a sinusoidal modulation is observed. The phase of the modulation relates to the X & Z position of the wafer (and hence the X & Z position of a wafer table which supports the wafer). Three different sine waves are shown in FIG. 8, the first sine wave 20 was generated with the mask and wafer gratings having the relative positions shown in FIG. 6, the second sine wave 21 was generated with the starting position of the wafer grating having been displaced by 43 mm in the X-direction and the third sine wave curve 22 was generated with the starting position of the wafer grating having been displaced by 43 mm in the −X-direction.

The period of the sine waves 20-22 is half the period of the wafer grating (the period is 215 nm). The first combination order (i.e. the signal seen at the first detector D1) varies with the same sign as the second combination order (i.e. the signal seen at the second detector D2). This is clear from FIG. 8 because only one sine wave is seen for each nominal initial position of the wafer grating. Thus, changing the position in the X-direction of the wafer grating will cause both detectors D1, D2 to detect a change of phase which varies with the same sign. This is because the intensity of the signal at the detectors D1,D2 depends upon the extent to which bright lines of the imaged mask grating overlap with reflective portions of the wafer grating (which does not vary for different detectors).

Figure 9:
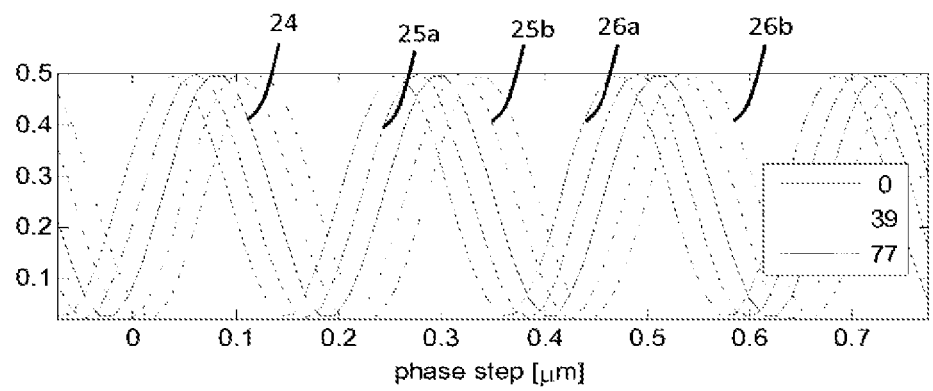

FIG. 9 shows the effect of moving the wafer grating out of the focal plane of the projection system. A first sine wave 24 is generated by phase stepping the wafer grating in the X-direction when the wafer grating is in the focal plane of the projection system. As may be seen, this first sine 24 wave corresponds with the first sine wave shown in FIG. 8 (the detectors D1, D2 both receive the same signal). When the wafer grating is located 39 nm below the focal plane of the projection system a pair of sine waves 25a,b is seen. In this case the first combination order (as seen by a first detector D1) is a first sine wave 25a and the second combination order (as seen by a second detector D2) is a second sine wave 25b. As can be seen, the first and second sine waves 25a,b are spaced by equal amounts either side of the sine wave 24 that was generated when the grating was in the focal plane. Thus, moving the wafer grating out of the focal plane generates a phase offset which has an opposite sign for each combination order. The phase offset which is observed arises from interference between constituent parts of the combination orders L0,1, L1,-1, R0,1, R1,-1. This interference arises because the incident radiation L0, L1, R0, R1 which forms the combination orders has different angles of incidence (leading to different angles of tilt of the mask grating aerial image in the Z-direction). The sign of the phase is opposite for each combination order because the radiation is incident from opposite directions (and hence the angle of tilt has an opposite sign).

A second pair of sine waves 26a,b is also shown for a displacement of the wafer grating 77 nm below the focal plane. This pair of sine waves 26a,b is again equally spaced either side of the focal plane sine wave 24, again showing that the combination orders have phase offsets with different signs. The observed phase difference is proportional to the applied defocus (i.e. is proportional to the distance from the focal plane of the projection system).

As will be appreciated from FIGS. 8 and 9, since an offset in the X-direction will give rise to signals at the detectors D1, D2 with the same phase, whereas a displacement in the Z-direction will give rise to signals with opposite phase, an X-direction offset can be distinguished from a Z-direction displacement. A difference used to measure the Z-direction displacement may be determined by subtracting two signals output from two detectors D1, D2 at the same time. Alternatively, a difference used to measure the Z-direction displacement may be determined by subtracting two signals output from a single detector D1 or D2 at different times.

In an embodiment, the mask substrate S may be provided with a second mask grating which extends in the Y-direction and may further be provided with a second pair of detectors and associated mirrors. A grating extending in the Y-direction may also be provided on the wafer. Thus, positions in the Y-direction may be measured in addition to positions in the X-direction.

When measuring positions in the Y-direction, movement of the wafer which includes a component in the Y-direction is required. This may be movement of the wafer exclusively in the Y-direction. Alternatively, it may be movement of the wafer in some other direction which includes a Y-direction component, in which case the detected phase will vary proportionally to the projection of the movement in the Y-direction. The movement may be orthogonal to the Z-direction. Similarly, when measuring positions in the X-direction movement of the wafer which includes a component in the X-direction is required. The movement may be orthogonal to the Z-direction.

Movement in the Z-direction may also be used to generate signals at the detectors which allow position sensing. However, such movement does not allow positions across the surface of the wafer to be measured and thus is not preferred.

In an alternative embodiment, as described below, the mask sensor apparatus may be provided with a two-dimensional grating and detectors which are orientated at 45 degrees relative to the X and Y directions (where the Y-direction is the scanning movement direction of the lithographic apparatus). This allows simultaneous measurements of the wafer grating position in the X, Y and Z directions to be obtained. In general, any movement which includes a component which lies in the X-direction and a component which lies in the Y-direction may be used to obtain measurements of grating position in the X, Y and Z positions.

Figure 10:
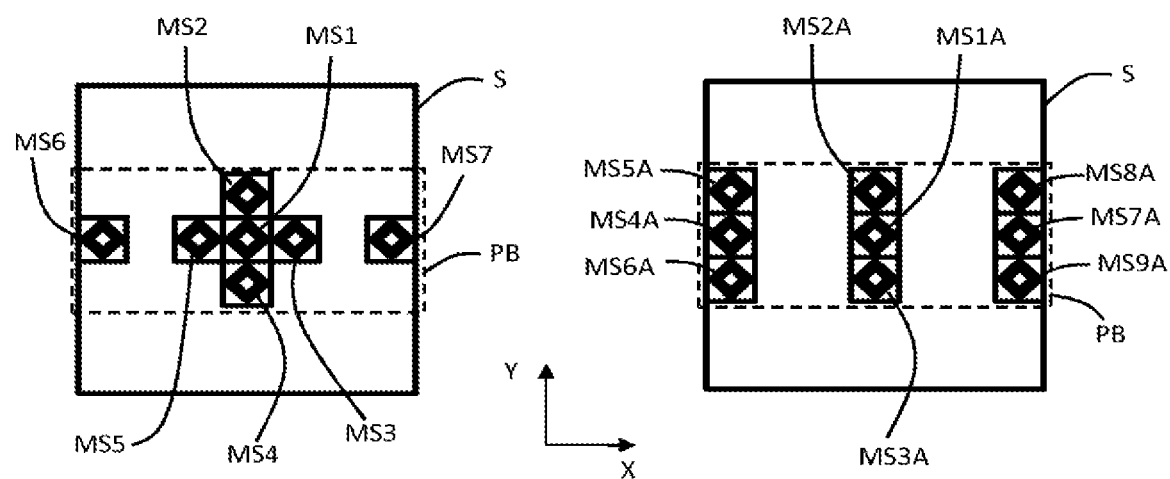
FIG. 10 schematically depicts a mask sensor apparatus comprising a plurality of mask sensor modules according to an embodiment of the invention.

The left hand side of FIG. 10 schematically illustrates a mask sensor apparatus which, instead of comprising a single mask grating and associated detectors, comprises a plurality of mask gratings and associated detectors (MS1-MS7), each of which may be referred to as a module. The mask sensor apparatus is viewed from below, and comprises a mask substrate S (e.g. formed from quartz) upon which seven modules MS1-MS7 are provided. Five of the modules MS1-MS5 are provided at the centre of the mask substrate S, with additional modules MS6, MS7 being provided at edges of the mask substrate S. In use, at a given moment in time the seven modules MS1-MS7 each measure the X, Y and Z position of the same wafer grating. The wafer grating extends sufficiently far in the X and Y directions that the mask grating aerial image formed from each module MS1-MS7 is incident upon that wafer grating. The wafer grating may for example extend across substantially all of the wafer. The wafer is moved relative to the projection system in a phase-stepping manner (as described above) such that each module MS1-MS7 measures the X, Y, Z position of the wafer grating for a variety of positions of the wafer. This provides a plurality of measurements which together may be used to distinguish between a deviation of the wafer grating from a desired location on the wafer and an error in the positioning of the wafer.

Distinguishing between deviation of the wafer grating from a desired location on the wafer and an error in the positioning of the wafer can be achieved by monitoring both the positions measured by the modules and the separation between those measured positions. For example, considering the Y-direction, during a single measurement cycle three modules MS1, MS2, MS4 measure the position of the wafer grating. These positions may be referred to as P1, P2 and P3. The controller CT (see FIG. 1) or some other processor measures the separation between these measured positions. The measured separations may be referred to as $\Delta P1,2$ and $\Delta P2,3$. Unlike the measured positions P1-P3 the measured separations $\Delta P1,2$ and $\Delta P2,3$ are independent of errors in the positioning of the wafer (this is because they are different measurements rather than absolute position measurements). Similarly, considering the X-direction, measurements of the wafer grating position and separation measurements are performed.

The separation measurements are used to create a map of the wafer grating which maps deviations of the wafer grating from desired locations across the surface of the wafer. The map may comprise vectors which indicate the direction and amplitude of wafer grating deviations across the surface of the wafer.

Once the map of wafer grating deviations has been determined, the wafer grating deviations can be subtracted from the positions measured using the modules MS1-MS7. This removes the effect of the wafer grating deviations from the measured positions, such that the resulting measured positions depend solely on errors in the positioning of the wafer. Thus, a map of wafer positioning errors is thereby obtained. The map may be in the form of vectors, the vectors indicating the direction and amplitude of the positioning errors (which may also be referred to as wafer writing errors). At each wafer position (x,y) the vector has three properties $dX(x,y)$, $dY(x,y)$, $dZ(x,y)$ and thus is a vector in three dimensions.

As noted above, two of the modules MS6, MS7 are provided at edges of the mask substrate S of the mask sensor apparatus. Providing these modules MS6, MS7 with a relatively large separation in this manner is advantageous because it improves detection of low frequency changes of the height of the wafer grating. That is, the signal to noise ratio provided for such low frequency changes (e.g. a change which occurs over a few mm or even cm) is improved. Although modules MS6, MS7 are shown as being provided at edges of the mask substrate, they may for example be provided at or adjacent to edges of the mask substrate. In general, the greater the separation between the modules MS6, MS7 the better the sensitivity to low frequency changes of the wafer grating height. A low frequency change of the wafer grating height may equivalently be thought of as a tilt of the wafer grating about the Y-direction.

Providing two modules MS6, MS7 at or adjacent to edges of the mask substrate S also improves the signal to noise sensitivity of the mask sensor apparatus to rotation of the wafer grating about the Z-direction and expansion (or contraction) of the wafer grating in the X-direction.

The modules MS1-MS7 can be positioned such that they all measure the same (relative) phase. That is, for a given measurement cycle (i.e. a single measurement by each module) each module would generate the same output if there was no deviation of the wafer grating and no error in the positioning of the wafer. In general, three measurements of a sine wave are needed in order to determine the amplitude and phase of the sine wave. Since the modules MS1-MS7 are measuring sine-wave signals (as explained in connection with FIGS. 8 and 9) three or more measurements are required in order to characterise the measured sine wave.

In an alternative embodiment, three modules (e.g. MS1, MS3, MS5 or MS1, MS2, MS4) can be positioned such that they perform measurements which are 120 degrees out of phase (relative to each other). That is, they are positioned such that if there was no deviation of the wafer grating and no error in the positioning of the wafer then they would generate outputs 120 degrees out of phase of each other. In such an embodiment a single measurement cycle (i.e. a single measurement by each module) provides enough information to characterise the measured sine wave. Thus, a single measurement cycle provides a wafer grating measurement in the X, Y and Z directions.

An alternative embodiment of the mask sensor apparatus is shown on the right hand side of FIG. 10. In this alternative embodiment three modules MS1A-MS3A are located at the centre of the mask substrate S and separated from each other in the Y-direction (i.e. the scanning direction of the lithographic apparatus). The separation between each adjacent module MS1A-MS3A may correspond with a 120 degree relative phase offset. Three modules MS4A-MS6A are located along or adjacent to one edge of the mask substrate S and three modules MS7A-MS9A are located along or adjacent to an opposite edge of the mask substrate.

In each case the separation between each adjacent module MS4A-MS6A, MS7A-MS9A may correspond with a 120 degree relative phase offset. The embodiment shown on the right hand side of FIG. 10 allows measurement of the wafer grating position with three degrees of freedom X, Y, Z and measurement of the wafer grating rotation with three degrees of freedom Rx, Ry & Rz to be performed in a single measurement cycle.

In general terms, in order to determine the phase of an oscillating signal (such as the signals shown in FIGS. 8 and 9) multiple intensity measurements with different wafer to mask alignments are needed. Three parameters are fitted to the oscillating signal: offset, modulation & phase. It is for this reason that three intensity measurements are needed (e.g. separated by 120 degrees).

The intensity measurements may be sequential (same detector over time) or in parallel (multiple detectors at a single time). In the latter case a plurality of detectors are needed. A wafer table has six degrees of freedom (X, Y, Z, Rx, Ry, Rz) and at least three measurements are needed for each degree of freedom. Thus, there are at least 18 unknowns. Each module provides three independent intensity signals (the fourth signal is redundant). Thus, at least six modules may be required in order to measure all degrees of freedom of the wafer table simultaneously.

Figure 11:
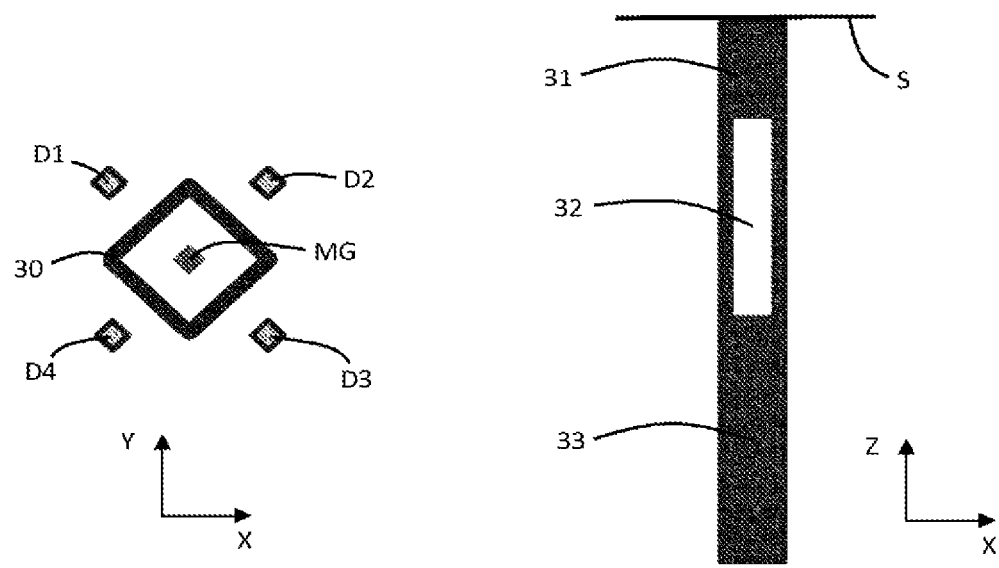
FIG. 11 depicts one wall of one of the mask sensor modules.

FIG. 11 schematically shows one mask grating and detector module in more detail. From FIG. 11 it may be seen that the mask grating MG is orientated at 45 degrees relative to the X and Y axes, and similarly the detectors D1-4 are also oriented at 45 degrees relative to the X and Y axes. As is explained further below, orienting the mask grating MG and the detectors D1-4 in this manner allows both X and Y positions of the wafer grating to be measured during phase stepping of the wafer.

Each module of the mask sensor apparatus further comprises a tower 30 which extends downwardly from the mask substrate S. The tower comprises four walls, one of which 31 is shown viewed from one side in FIG. 11. The wall 31 is provided with an opening 32 which is dimensioned to allow transmission of radiation propagating diffracted by the mask grating MG over a predetermined range of angles. The wall 31 has a reflective surface 33 below the opening 32 which in use reflects a combination diffraction order. Referring to FIG. 11 in combination with FIGS. 3 and 5, it can be seen that in an embodiment the opening 32 may allow for transmission of an incident zero diffraction order L0 (or R0) and the reflective surface 33 may reflect a combination order L0,1, L1,-1 (or R0,1, R1,-1). The wall 31 may also block transmission of an incident second diffraction order L2 (or R2).

Appropriate dimensions and positioning of the opening 32 may be selected using trigonometry. The tower 30 may extend downwardly from the mask substrate S by for example 6 mm (this depth may be provided in the lithographic apparatus to accommodate a pellicle during normal use). As explained further above in connection with FIG. 3, the tower 30 is configured to block second order diffraction generated by the mask grating MG. The range of angles which corresponds with second order diffraction in this embodiment lies between ⅓ and ⅔ of the numerical aperture NA of the projection system. In this embodiment the numerical aperture of the projection system is 1.35/4 (the division by 4 is to take account of the reduction factor of the projection system). Thus, the range of angles to be blocked is calculated as:

$$1/3*1.35/4 < \sin(\theta) < 2/3*1.35/4 => 6.46° < \theta < 13°$$

Since the height of the tower is 6000 μm, the lateral separation d of the tower wall from the centre of the mask grating is calculated as:

$$d = 6 \tan(6.46°) = 679 \text{ μm}.$$

As can be seen with reference to FIG. 5, the tower 30 is configured to reflect the combination order which is to be incident upon a detector. The combination order has the same range of angles as indicated above, i.e. 6.46°<θ<13°. It is desirable for the wall of the tower to reflect over this range of angles without reflecting other angles, in order to filter out diffraction orders which should not be incident upon the detector. The opening 32 may thus begin at a position h (measured from the mask substrate) which corresponds with θ=13°. This is calculated as:

$$h = 679/\tan(13°) = 2942 \text{ μm}.$$

An upper end of the opening may be positioned at 1895 μm from the mask substrate to block radiation which is diffracted at θ>19.7°.

Figure 12:
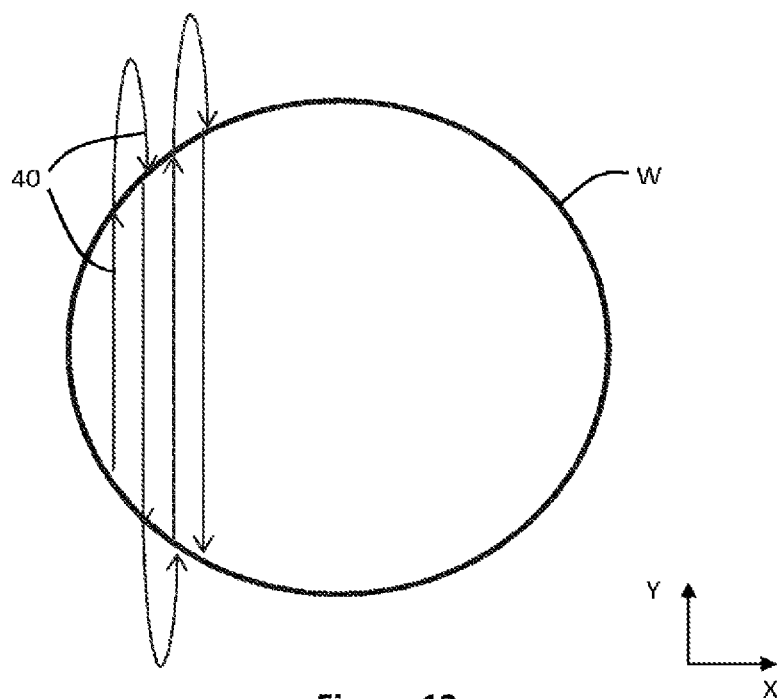
FIG. 12 depicts a method of calibrating wafer table positions across the surface of a wafer.

Referring again to FIG. 2, in use the mask sensor apparatus MS is illuminated with a radiation beam PB and then a wafer W upon which a wafer grating WG has been provided is moved beneath the projection system PL. The wafer may for example follow a route which allows the positions of the wafer grating across substantially the entire wafer to be measured. An example of such a route is schematically illustrated in FIG. 12. In FIG. 12 movement of the wafer W is indicated by arrows 40. As can be seen, the movement comprises a series of linear movements in the Y-direction which are separated from each other in the X-direction. Changes of direction and movement in the X-direction take place when the wafer is not being illuminated by the radiation beam, so that only Y-direction movement occurs when the wafer is illuminated by the radiation beam. The wafer may be moved incrementally, with a measurement being performed after each movement (these movements may be referred to as phase steps). The movements and measurements may be synchronised with laser pulses which form the radiation beam. Alternatively, the wafer may be moved with a continuous scanning motion, the output of the detectors being sampled at a rate which is sufficiently fast to allow phase measurements to be obtained.

In an alternative arrangement instead of performing measurements which are synchronised with the laser pulses, measurements may be taken from the detectors continuously and sampled into discrete 'measurement bins' using electronics. The rate at which this sampling takes place may be determined by control electronics and may be independent of the frequency of the laser pulses. Thus, in the resulting discreet measurements, each measurement will either be a finite intensity measurement (for discreet measurements which occurred when the laser was on) or will be zero intensity (for discreet measurements which occurred when the laser was off). An advantage of using this arrangement is that a plurality of discreet measurements may be sampled during a single laser pulse, thereby allowing more information to be obtained than would be the case if a single measurement per laser pulse were to be performed. This in turn allows the wafer table to be moved more quickly than may otherwise be the case. A further advantage is that there is no requirement to link the laser electronics to the measurement electronics in order to achieve synchronisation.

In an embodiment the separation between adjacent measurements may be 1 (i.e. a measurement is performed every 1 mm). The separation in the X-direction between adjacent scans may for example also be 1 mm. Other separations in the X and Y-directions may be used, and this may depend upon the fineness or coarseness of a wafer positioning error map that is desired.

In an embodiment, instead of performing measurements every 1 mm (or some other relatively finely spaced separation) measurements may be performed only at positions which correspond to exposure positions during subsequent use of the lithographic apparatus. For example, if the lithographic apparatus will be used to expose dies which are 26 mm by 33 mm, measurements may be performed at positions which correspond only to positions that will subsequently be used during exposure of dies. In this example, a separation of 26 mm in the X-direction between adjacent scans may be used. This approach provides the advantage that position errors are measured only at positions which will subsequently be used during wafer exposure. This reduces the number of measurements which are required and thereby reduces the time required. It also allows measurement to be obtained of inter-field misalignments arising for example from wafer expansion and rotation for dies exposed at those positions. Higher order inter-field corrections may also be applied. A six degree of freedom intra-field correction may be applied during scanning exposure of the die (based upon measurements obtained using the embodiment of the invention).

Figure 13:
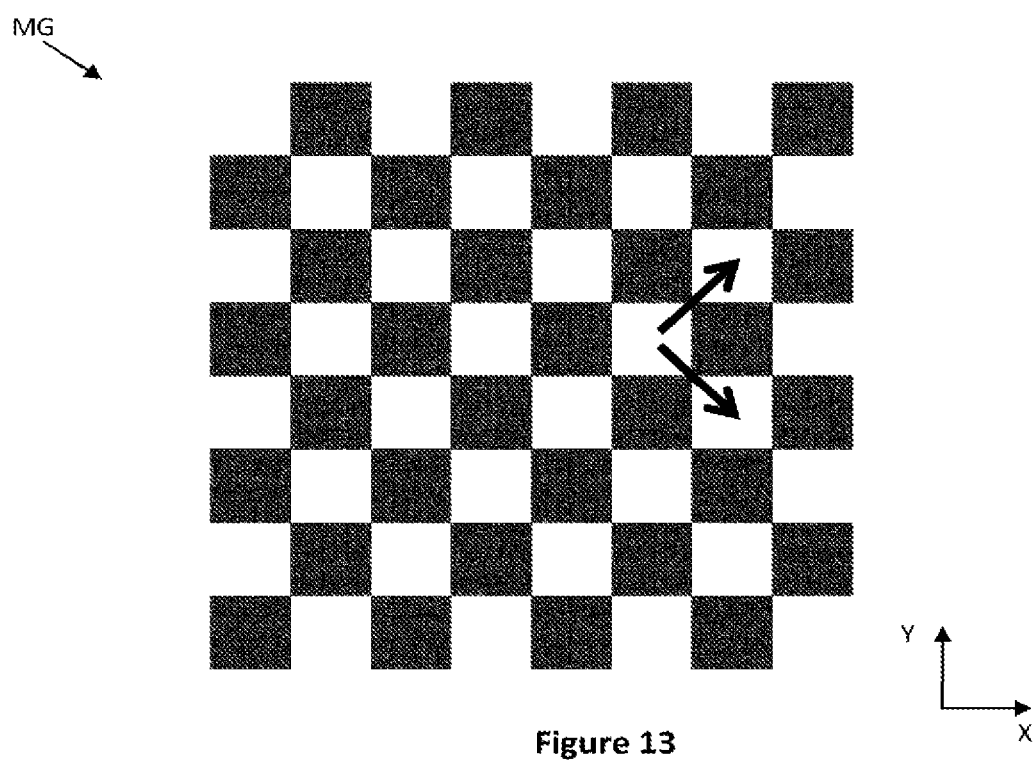
FIG. 13 schematically depicts a diffraction grating which forms part of some embodiments of the invention.
Figure 14:
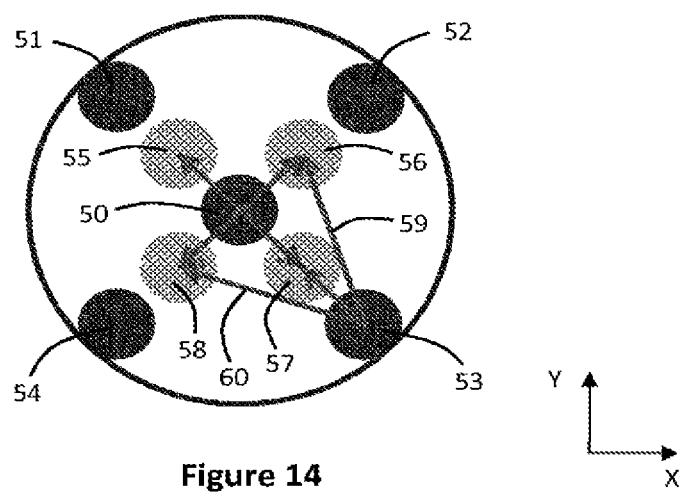
FIG. 14 schematically depicts mixing of diffraction orders in an unwanted manner.

FIG. 13 represents schematically a mask diffraction grating MG which extends in the X and Y directions (and thus has a form which may be referred to as a checker-board). When a mask diffraction grating MG of the type shown in FIG. 13 is used a wafer grating having a corresponding form may be used (e.g. with a period which is double the period of the mask grating). The wafer grating may extend across substantially an entire wafer. This does not preclude other marks such as alignment marks also being on the wafer (e.g. in gaps provided in the wafer grating). The mask diffraction grating generates diffraction orders in directions illustrated by the arrows. That is, diffraction in the X=Y direction occurs and diffraction in the X=−Y direction occurs. Quadrupole illumination is used for this embodiment (e.g. as schematically illustrated in FIG. 14 below). Referring again to FIG. 10, the mask sensor apparatus MS can be used to simultaneously measure with four detectors D1-4 the relative alignment of the mask and wafer gratings, and also the displacement in the Z-direction away from the focal plane of the wafer grating. This may be achieved by moving the wafer in the manner shown in FIG. 12 whilst monitoring the outputs of the detectors D1-D4.

FIG. 14 illustrates schematically a problem which may occur when a grating which gives rise to diffraction in orthogonal directions (e.g. a checker-board grating) is used. FIG. 14 schematically shows in a pupil plane how unwanted mixing between diffraction orders can take place. A quadrupole illumination mode comprising four poles 51-54 is used to illuminate a mask grating. Radiation is diffracted as zero diffraction orders 51-54 and a first diffraction order 50. As is schematically indicated by the arrows in the figure, this radiation is diffracted in orthogonal directions (X=Y and X=−Y) by a mask grating (which also has a checker-board form). As a result, +/−first diffraction orders of poles 50 & 53 mix together to form a combination order 57, +/−first diffraction orders of poles 50, 52 mix together to form a combination order 56, etc (combination orders 55-58 are indicated by patterned disks). However, in addition, some radiation will be diffracted in unwanted directions. For example, as illustrated by arrows 59,60 some radiation will be diffracted pole 53 as a first order in the X=Y direction and as a second order in the X=−Y direction (and vice versa). As a result, the radiation from this pole 53 will mix in an unwanted manner with combination diffraction orders 56,58.

The unwanted mixing of diffracted radiation will affect in an undesirable manner the signals detected at the detectors D1-4 of the mask sensor apparatus MS. Although a linear relationship between detected phase and X and Y displacement will remain, the relationship between phase and displacement from the lens focal plane in the Z-direction will no longer be linear. Various solutions to this problem are possible. A first solution is to measure the non-linear response and thereby obtain a calibration of the signals which takes the non-linear response into account. This may be done by stepping the wafer grating in the X-direction only and measuring the signals output by the detectors, stepping the wafer grating in the Y-direction only and measuring the signals, and stepping the wafer grating in the Z-direction only and measuring the signals.

An alternative approach is to provide the wafer gratings as separate gratings which extend in orthogonal directions. Where this is done, position measurements in the X and Z directions may be obtained using the wafer grating which extends in the X-direction. Position measurements in the Y and Z directions may separately be obtained using the wafer grating which extends in the Y-direction. When this approach is used the mask grating may be a two-dimensional grating and the mask sensor apparatus may comprise four detectors. The detectors do not see the unwanted mixing between diffraction orders illustrated in FIG. 14. This is because during measurement using wafer gratings which extend in the X-direction no diffraction orders with Y-direction components are seen, and similarly during measurement using wafer gratings which extend in the Y-direction no diffraction orders with X-direction components are seen.

A further alternative approach is to provide separate gratings which extend in orthogonal directions (e.g. the X and Y directions) on the reticle and a grating which extends in both directions (e.g. the X and Y directions) on the wafer. If the wafer has a one-to-one duty cycle and double the period of the reticle grating then each detector will only see two interfering orders (e.g. as shown in FIGS. 3-5). A disadvantage of this approach compared with using separate X and Y direction gratings on the wafer is that the mask sensor apparatus associated with the X-direction mask grating must be separate from the mask sensor apparatus associated with the Y-mask grating (i.e. two mask sensor apparatus are needed).

A further alternative solution is described below. This may be a preferred solution because it does not require extra measurement scans and does not require calibration of a non-linear response. Two or more of the solutions may be combined together.

Figure 15:
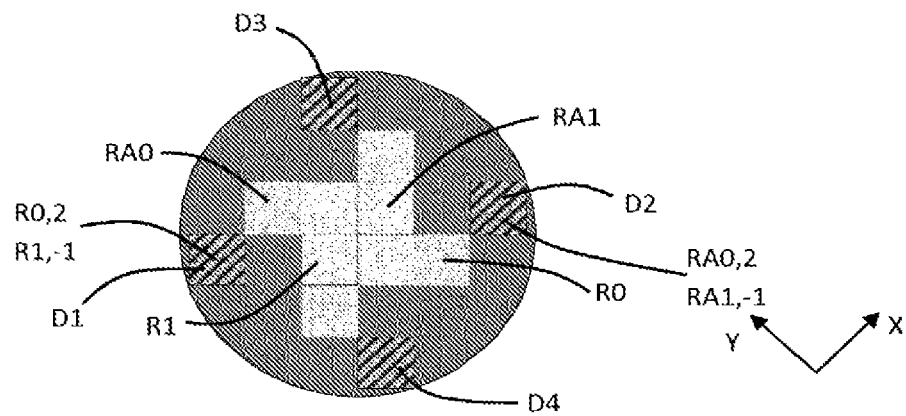
FIG. 15 schematically depicts an embodiment of the invention which avoids or reduces unwanted mixing of diffraction orders.

In an embodiment, the mask sensor apparatus MS may be arranged such that the openings in the tower are laterally offset (i.e. offset in the plane of the mask substrate S). The poles of the illumination mode used to illuminate the mask sensor apparatus may be correspondingly offset. This may allow the above problem to be reduced or avoided completely. FIG. 15 illustrates schematically one way in which this can be achieved. The figure shows schematically in a pupil plane different diffraction orders which are used to generate a detected signal. Illumination is provided by an offset quadrupole mode radiation beam (described further below). The poles have a sigma of between approximately 1/3.2 and around 2/3.2. One pole is diffracted by the mask grating to form a zero order R0 and a first order R1. Interference at a wafer grating between these two orders R0,R1 generates a combination order R0,2, R1,-1. Unlike in the embodiment described further above, the period of the wafer grating is the same as the period of the mask grating, and generates a combination order which does not lie in-between the existing diffraction orders but instead is to one side of the existing orders. As indicated by the notation, one of the orders R0,2 of the combination order is a second order diffraction of incident zero order radiation R0. The other order R1,-1 of the combination order is a first order diffraction of incident first order radiation R1. The intensity of the combination order R0,2, R1,-1 is detected by a detector D1 and is used to measure the X, Y, Z position of the wafer grating in the same manner as described above. Thus, the detector detects radiation which is diffracted twice in a first order and detects radiation which is diffracted in a zero order and a second order. Using this combination of diffraction orders is advantageous because it allows optimization of the diffraction gratings such that the intensity of both orders which form the combination order is equal. As a result the radiation detected will have 100% contrast.

As can be seen from FIG. 15, the combination order R0,2, R1,-1 which is detected by the detector D1 is generated by diffraction in the X=-Y direction. A second detector D2 is also arranged to measure a combination order generated by diffraction in the X=-Y-direction. However, the pole which is used to generate diffraction detected by the second detector D2 is offset in the X=Y-direction from the pole used to generate diffraction detected by the first detector D1. The mask diffraction grating generates zero order diffraction RA0 and first order diffraction RA1. The wafer diffraction grating then generates a combination order RA0,2, RA1,-1 which is detected by the second detector D2. This second combination order RA0,2, RA1,-1 is offset in the X=Y-direction from the first combination order R0,2, R1,-1 detected by the first detector D1. The first combination order R0,2, R1,-1 is selectively reflected to the first detector D1 by a laterally offset wall of the tower (other diffraction orders are filtered out by the wall) as described below. Similarly, the second combination order RA0,2, RA1,-1 is selectively reflected to the second detector by a laterally offset wall of the tower (other diffraction orders being filtered out by the wall).

In exactly the same way, diffraction orders are generated using poles which are offset in the X=Y-direction, the diffraction orders being detected by detectors D3, D4 which are offset in the X=-Y direction. These orders are not labelled in FIG. 15 to avoid over complicating the figure.

When the embodiment depicted in FIG. 15 is used, the problem illustrated by FIG. 14 is reduced or eliminated. As a result, the phase of the signal detected at the detectors D1-D4 varies linearly as a function of the z-position of the wafer grating.

Figure 16:
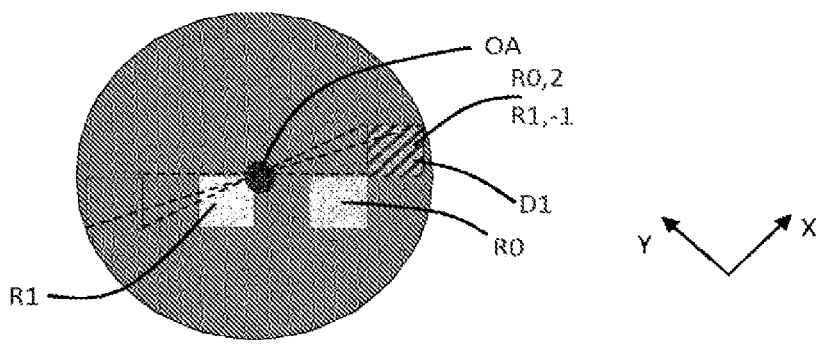
FIG. 16 schematically depicts the embodiment of FIG. 15 but shows the effect of off-axis illumination.

FIG. 15 is a simplification in the sense that it does not show the effect of the mirroring of the diffraction orders relative to the optical axis upon wafer reflection. (this was done in order to avoid over complicating FIG. 15). FIG. 16 illustrates schematically the effect of the mirroring. The optical axis OA, indicated by a disk, extends in the Z-direction (i.e. directly out of the plane of the figure). The illumination mode pole has a sigma of between approximately 1/3.2 and around 2/3.2 and is offset from the optical axis OA in the -X=-Y direction. The pole is diffracted by the mask grating to form a zero order R0 and a first order R1. These propagate through the projection system PL of the lithographic apparatus and are then diffracted by the wafer grating WG (see for example FIG. 2). Because the diffraction orders R0 and R1 are off-axis, when they are diffracted by the wafer grating WG the resulting diffraction orders are also off-axis but on an opposite side of the optical axis OA. Thus, the resulting combination order R0,2, R1,-1 is mirrored in the optical axis to the incident diffraction orders R0, R1. The detector D1 is positioned to receive the combination order R0,2, R1,-1 and is thus also mirrored in the optical axis relative to the incident diffraction orders R0, R1.

Similar displacements of detectors relative to illumination mode poles are used for the other illumination mode poles.

Figure 17:
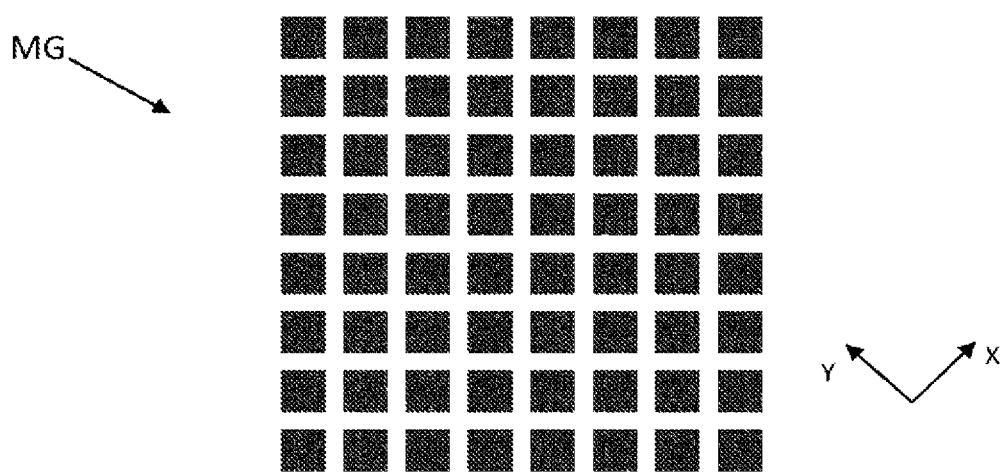
FIGS. 17-19 schematically depict generation and measurement of diffraction orders according to an embodiment of the invention which avoids or reduces unwanted mixing of diffraction orders.

FIGS. 17-20 illustrate schematically the generation and detection of the combination order R0,2, R1,-1 shown in FIGS. 15 and 16. FIG. 17 shows a mask grating MG which comprises squares separated by channels which are narrower than the squares. Thus, the mask grating MG does not have a one-to-one duty cycle and will generate some even diffraction orders. In an alternative arrangement the channels may be wider than the squares.

Figure 18:
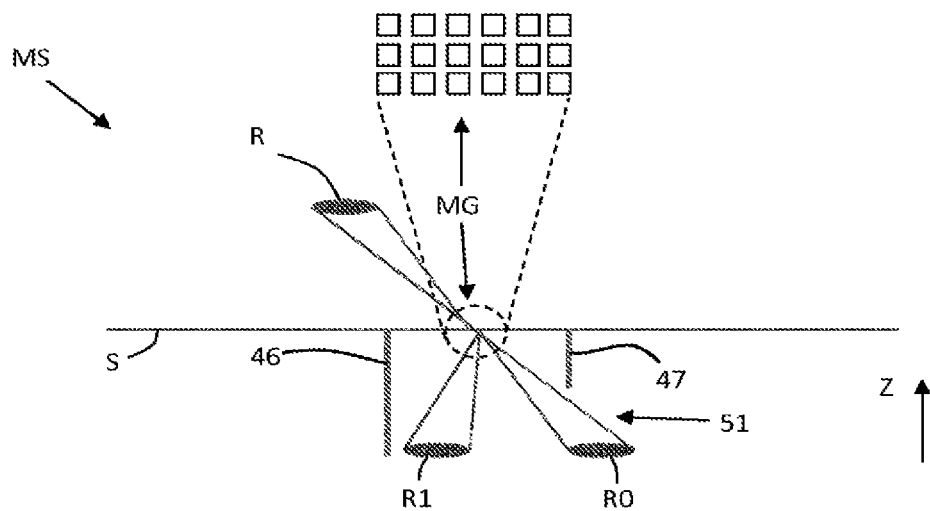

Referring to FIG. 18, the mask grating MG is shown on a mask substrate S. Also provided on the mask substrate S is a tower, of which two walls 46, 47 are visible in FIG. 16. One of the walls 46 has a reflective outer surface which acts as a mirror. The mask grating MG is illuminated with a radiation beam pole R which has an intermediate sigma. The mask grating MG diffracts the radiation beam pole and generates a zero diffraction order R0 and a first diffraction order R1. Other diffraction orders may be generated but these are blocked by the walls 46,47. The wall 47 on the right hand side of the tower is shorter than the wall 46 on the left hand side of the tower (in the plane shown in FIG. 17), thereby providing an opening 51 which allows transmission of the zero diffraction order R0. As is explained further below, the opening 51 is offset relative to the optical axis. Thus, the plane of FIG. 18 does not correspond with the optical axis. Instead, the plane of FIG. 18 lies behind a plane in which the optical axis lies.

Figure 19:
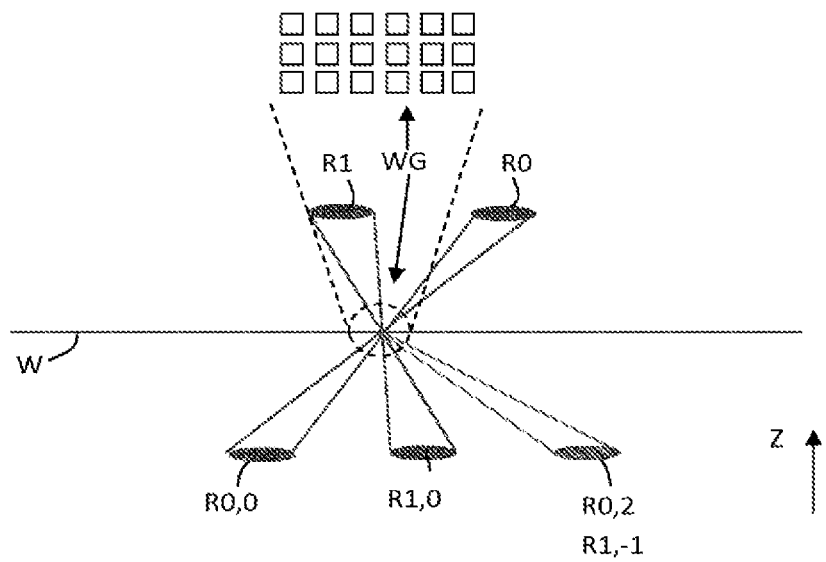

FIG. 19 shows a wafer W provided with a wafer grating WG. The wafer grating WG has the same period as the mask grating MG and thus will generate diffraction orders with the same angular separation. Again, the wafer grating does not have a one-to-one duty cycle and will generate some even diffraction orders. The zero diffraction order R0 and the first diffraction order R1 are incident upon the wafer grating WG. The zero diffraction order R0 is diffracted by the wafer grating WG as a zero order R0,0 and a second order R0,2. The first diffraction order R1 is diffracted by the wafer grating WG as a zero order R1,0 a first order R1,-1. Other diffraction orders may be generated but are not illustrated. A combination order R0,2, R1,-1 is formed.

Figure 20:
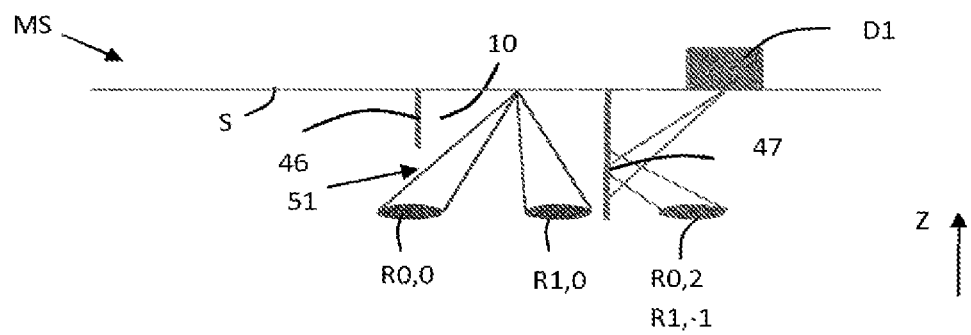
FIGS. 20-22 depict a tower which forms part of the embodiment depicted in FIGS. 17-19.

FIG. 20 shows the combination order R0,2, R1,-1 being reflected by a reflective surface of the tower wall 47. The combination order R0,2, R1,-1 is reflected by the wall 47 to a detector D1 where the intensity of the combination order is measured. The wall 47 does not reflect other diffraction orders, thereby ensuring that only the combination order R0,2, R1,-1 is incident upon the detector D1. The plane of FIG. 20 is different from the plane of FIG. 18—the plane has been stepped upwards out of the plane of the paper. This is due to the off-axis nature of the illumination pole, as was described above in connection with FIG. 16. Due to the off-axis nature of the illumination, portions of the tower walls 46,47 which block diffraction orders generated by the mask grating MG are different from portions of the tower wall which reflect diffraction orders generated by the wafer grating WG.

Figure 21:
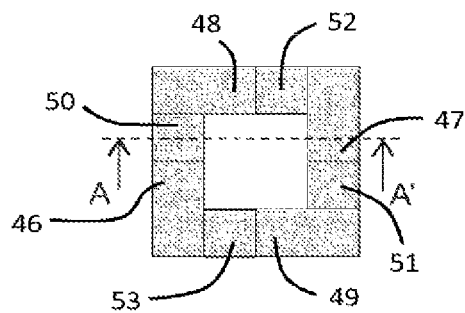
Figure 22:
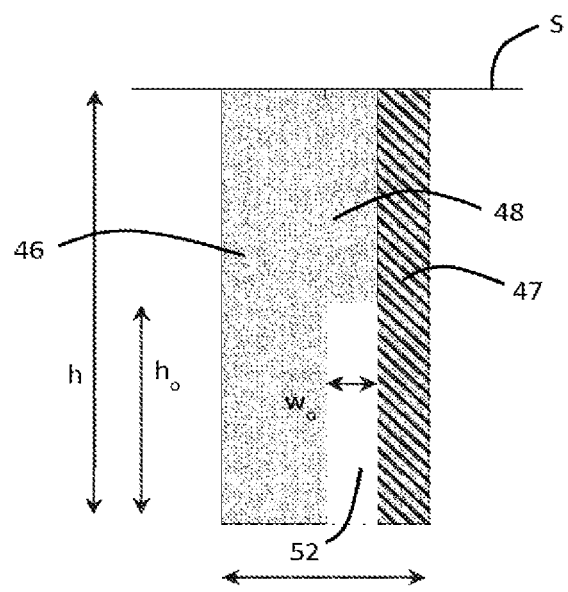
Figure 23:
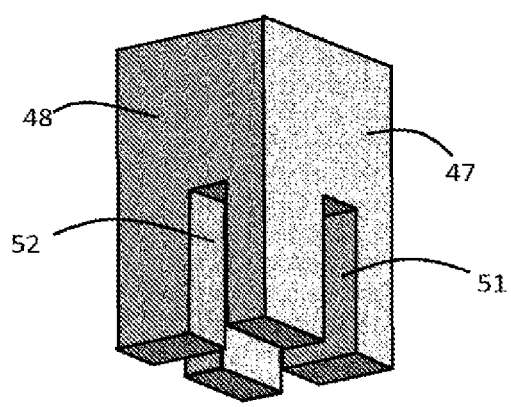
FIG. 23 schematically depicts an alternative embodiment of the invention.

FIGS. 21-23 illustrate the tower which forms part of this embodiment of the invention. FIG. 21 shows the tower viewed from below, FIG. 22 is a cross-sectional view of the tower along line AA', and FIG. 23 shows the tower in perspective view. Referring first to FIGS. 21 and 22, the tower is formed from four walls 46-48. Each wall is provided with an opening 50-53 which extends from a lowermost end of the tower (i.e. the end opposite the mask substrate which supports the tower) and ends partway up the tower. Each opening is offset from the centre of the wall in which it is provided. The purpose of this offset can be understood from FIG. 18. In that figure the opening 51 in the right-hand wall 47 allows the zero diffraction order R0 to pass so that it can be incident upon the wafer grating. The portion of the right-hand wall 47 which is above the opening in FIG. 21 (i.e. the portion through which the dashed line passes) is not provided with an opening but instead has a reflective surface which acts to reflect the combination order R0,2, R1,-1 to the detector D1 (see FIG. 20). If an opening were to be present then the combination order would not be reflected to the detector. In general, the openings 50-53 are positioned and dimensioned such that they allow transmission of zero order diffraction from the mask grating whilst blocking higher order diffraction from the mask grating (first order mask grating diffraction passes out of the bottom of the tower whilst second orders and above are blocked by the tower). In addition, the openings 50-53 are positioned and dimensioned such that they are offset from, and do not coincide with, combination orders which are to be reflected towards detectors.

FIG. 23 is a perspective view of the tower, showing two walls 47, 48 and corresponding openings 51, 52.

The dimensions of the tower may be in part constrained by the space available in the lithographic apparatus. For example, in an embodiment the tower T may have a height h of 5 mm (i.e. may extend downwardly from the mask substrate by 5 mm). The lateral dimensions of the tower and the size and position of the openings 50-53 may be determined based upon the modelling of the incident radiation beam, the positions and sizes of diffraction orders generated by the mask grating, and the positions and sizes of combination orders generated by the wafer grating. For example the tower may have a width w of around 2.2 mm. Each opening 50-53 may have a height $h_o$ of around 2.5 mm and may have a width $w_o$ of around 0.5 mm. Each opening 50-53 may extend from the centre of tower to one side of the tower (the opening ending at the inner surface of the next wall). The walls 46-49 of the tower may have a thickness of around 0.55 mm.

The tower may be formed from quartz, metal or any other suitable material. The material may be sufficiently conducting of heat to avoid damage being caused by radiation that is absorbed by the tower.

The tower, in combination with the offset illumination mode poles, avoids detection by the detectors D1-D4 of unwanted diffraction combinations (e.g. those depicted in FIG. 14). As a result, the signals seen at the detectors D1-D4 vary linearly as a function of wafer grating distance from the focal plane of the projection system.

Figure 24:
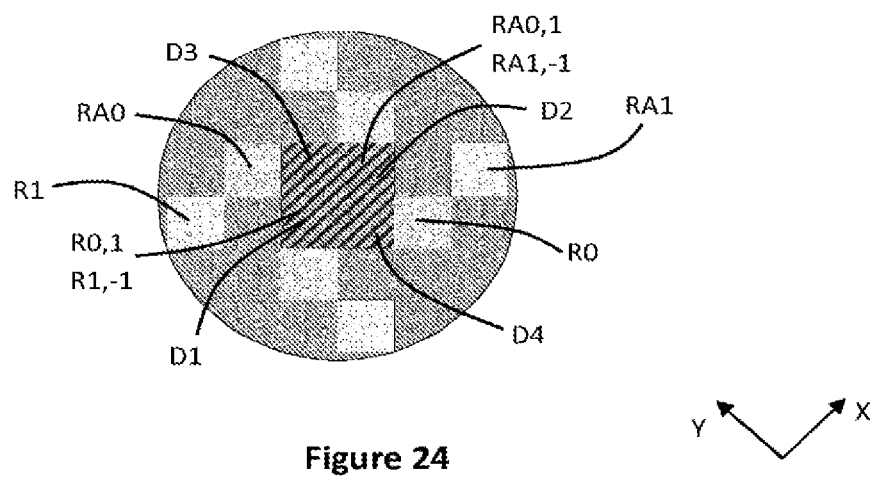
FIG. 24 schematically depicts the embodiment shown in FIG. 15 and an alternative related embodiment.

FIG. 24 schematically illustrates a further alternative embodiment of the invention. The format of FIG. 24 corresponds with the format of FIG. 15, i.e. the positions of diffraction orders and detectors are represented schematically in a pupil plane and the effect of the offset relative to the optical axis is not shown. In FIG. 24 incident radiation (and hence also zero order diffracted radiation) again has an intermediate sigma (between 1/3.2 and 2/3.2). In this embodiment however the detectors D1-D4 are located close the centre of the pupil. Taking one pole as an example, zero order diffraction R0 and first order diffraction R1 are generated by a mask grating. A combination order R0,1 R1,-1 is generated by a wafer grating and is incident upon a detector D1 close to the centre of the pupil. Similarly, considering the corresponding (laterally offset) pole, zero order diffraction RA0 and first order diffraction RA1 are generated by a mask grating. A combination order RA0,1 RA1,-1 is generated by a wafer grating and is incident upon a detector D2. The embodiment shown in FIG. 24 may be considered to be less advantageous than the previously depicted embodiment because it may be difficult in practice to locate four detectors D1-D4 adjacent to each other. This may be addressed for example by positioning mirrors instead of detectors in the locations labelled D1-D4 and orienting the mirrors such that each mirror directs a different combination order to a different detector located at other suitable positions on the mask substrate of the mask sensor apparatus.

Figure 25:
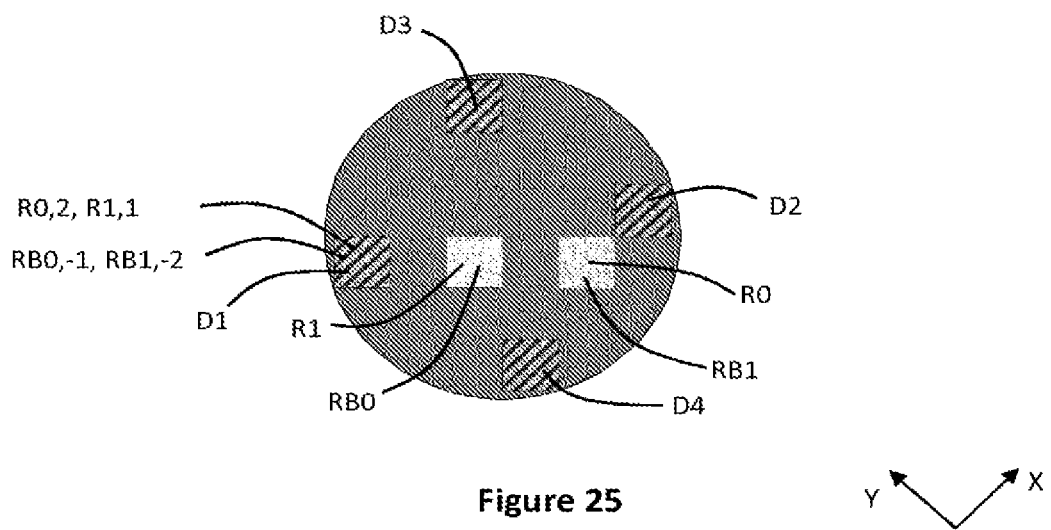
FIG. 25 schematically depicts a further alternative embodiment of the invention.

FIG. 25 illustrates schematically the effect of using alternative illumination modes to illuminate the mask grating. FIG. 25 is similar to FIG. 15, and detectors D1-D4 are depicted at the same locations. However, for simplicity only diffraction modes used for one detector D1 are shown. As described further above an intermediate sigma pole (1/3.2-2/3.2) may be used to illuminate the mask diffraction grating, the mask diffraction grating generating zero order diffraction R0 and first order diffraction R1. The wafer grating will generate a combination order R0,2 R1,1 which is incident upon a detector D1. In an alternative arrangement however, an illumination pole with a smaller sigma (0-1/3.2) may be used to illuminate the mask diffraction grating. Where this is the case the resulting zero order diffraction RB0 and the first order diffraction RB1 have positions which are opposite to those seen for the intermediate sigma pole (achieved via selection of an appropriate mask grating period). The resulting combination order RA0,-1, RA1,-2 generated by the wafer grating is incident at the same location and hence incident at the same detector D1. Thus, it will be understood that the same mask sensor apparatus MS with the same detector configuration may be used for two different illumination modes, i.e. relatively small sigma poles (0/3.2-1/3.2) and intermediate sigma poles (1/3.2-2/3.2). Illumination using the intermediate sigma (1/3.2-2/3.2) illumination pole may be preferred because it provides a better contrast in the signal seen at the detector D1.

Illuminating the mask diffraction grating with an illumination mode having intermediate sigma poles (1/3.2-2/3.2) is advantageous because a better contrast of interference at detectors D1-D4 can be obtained (compared with relatively small sigma pole illumination).

The contrast of interference seen at the detectors D1-D4 depends upon the relative amplitudes of the two diffraction orders which together form the combination diffraction order that is detected. Contrast is maximised when the two diffraction orders have the same amplitudes. The amplitudes of the diffraction orders may be optimised via selection of the duty cycle of the mask grating and the duty cycle of the wafer grating (the duty cycle determines the relative amplitudes of different diffraction orders). The wafer grating is a phase grating, with phase arising from the depth of etch of the grating into the wafer. Modifying the etch depth may also be used to influence the relative amplitudes of different diffraction orders.

Figure 26:
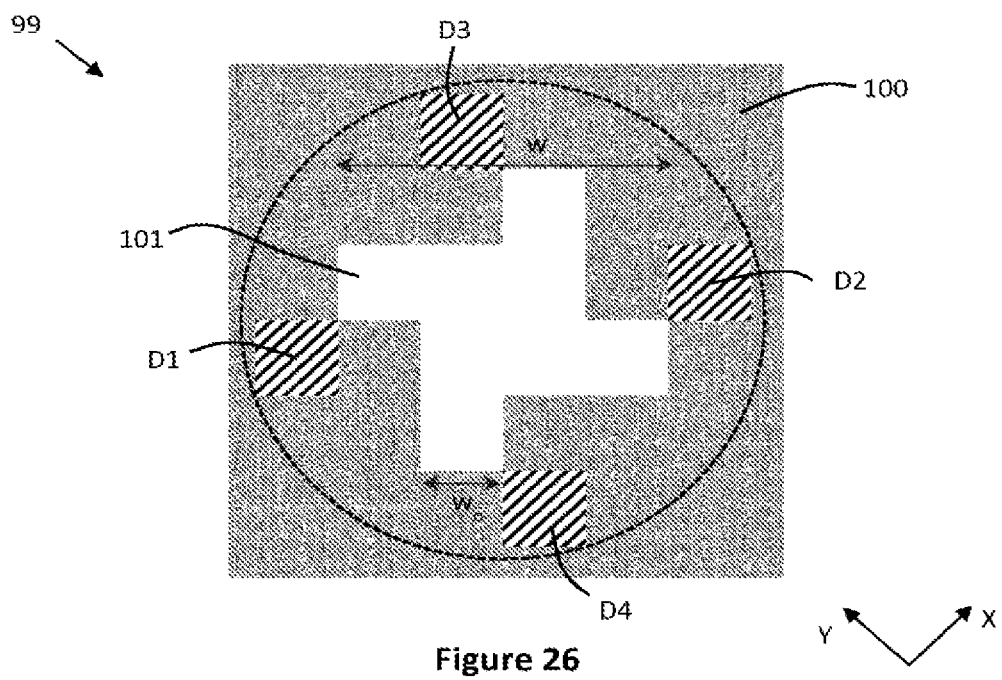
FIG. 26 schematically depicts a further alternative embodiment of the invention.

FIG. 26 illustrates schematically a sensor apparatus 99 according to a further embodiment of the invention. Unlike previously illustrated embodiments the sensor apparatus 99 is substantially two-dimensional (it does not include a tower or an equivalent structure extending downwardly from a mask substrate). The sensor apparatus 99 instead takes the form of a screen which is located out of the mask focal plane of the projection system (i.e. out of the plane in which a mask is provided during conventional operation of the lithographic apparatus). The screen may be located in a plane which corresponds with a plane in which a pellicle would be provided during conventional operation of the lithographic apparatus. For example, the screen may be around 5 mm or 6 mm below the mask focal plane. The screen comprises a radiation blocking material 100 in which an opening 101 has been provided. For example, the screen may be made from quartz provided with a reflective coating, the reflective coating being removed to provide openings through which radiation is transmitted. Detectors D1-D4 are provided in the screen and are arranged to detect radiation travelling back up through the projection system. The detectors D1-D4 do not detect radiation travelling from the illumination system towards the projection system but instead merely block such radiation. Thus, only radiation which is incident upon the opening 101 travels to the projection system.

The functionality provided by the screen 100 and the opening 101 corresponds with the functionality provided by the tower shown in FIGS. 21-23. In addition, relevant dimensions of the tower correspond with dimensions of the opening 101. Thus, each arm of the opening has a width $w_0$ which corresponds with the width $w_0$ of the openings 51-53 of the tower, and the full width w of the opening 101 corresponds with the width w of the tower. The functionality provided by the screen 100 and opening 101 corresponds with that shown in FIGS. 17-19, i.e. zero and first order diffracted radiation generated by a mask diffraction grating is transmitted whereas other orders are blocked by the screen. The detectors are positioned such that they detect only the combination order R0,2, R1,-1 (and equivalent orders), with other orders being incident at other locations on the screen where detectors are not present. When this embodiment is used a mask provided with a mask grating is also provided in the lithographic apparatus. The mask grating may be a few tens of microns in diameter, with the remainder of the mask being non-transmissive. Thus, the mask grating may have the form of a pinhole which is provided with a grating. The mask grating should be positioned relative to the mask such that desired diffraction orders pass through the opening 101 and desired combination orders are incident on the detectors D1-D4. Underfilling of the diffraction modes via appropriate selection of illumination radiation poles may be used to provide some tolerance in the positioning of the mask grating relative to the screen.

Although the embodiment shown in FIG. 26 comprises a single opening 101 and four detectors D1-D4, more than one opening and associated detectors may be provided in the screen. For example, openings and detectors may be provided in an arrangement which corresponds with that shown in FIG. 10. Where this is the case a corresponding mask grating may be provided for each opening.

An advantage of the embodiment shown in FIG. 26 is that it may be easier to fabricate and less prone to damage because it does not include a tower.

The detectors used may be photodiodes which are located at the positions D1-D4 shown in FIG. 26. Alternatively, optical fibres may be used to transport radiation to photodiodes located remotely from the positions D1-D4 shown in FIG. 26. In this situation, although the detectors are not physically located at the illustrated positions D1-D4, they nevertheless do detect radiation incident at those positions. Optical fibres may also be used in this manner for other embodiments of the invention. The use of optical fibres is advantageous because unlike electronic detectors the optical fibres will not generate heat and thus do not give rise to thermal conditioning requirements. In addition, optical fibres may occupy a smaller volume and may be more easily integrated into the apparatus than electronic detectors. Embodiments of the invention allow positioning of the wafer table to be calibrated for six degrees of freedom: position in the X, Y, Z directions and rotation Rx, Ry, Rz about the X, Y and Z axes. Thus, for each position (X,Y) of the wafer table the position error in the X, Y and Z directions is determined and the rotation error about the X, Y and Z axes is determined.

Embodiments of the invention provide numerous advantages over the prior art. For example, a calibration over an entire wafer can be performed in less than an hour (e.g. in around 15 minutes), instead of requiring several hours to expose, develop and measure a wafer. Since the calibration can be performed relatively quickly this allows it to be performed more regularly without it becoming uneconomic. A calibration could be performed for example in advance of exposing wafers with a particular die (or target area) layout. This is beneficial because both inter-field and intra-field alignment may include some die layout dependency.

References to a single wafer grating extending across substantially the entire surface of the wafer do not preclude other marks (e.g. alignment marks) being present on the wafer. A wafer grating which extends across substantially the entire surface of the wafer may include gaps in which other marks may be provided.

Although embodiments of the invention have been described in terms of a single wafer grating which extends across substantially the entire surface of the wafer, in other embodiments other forms of wafer gratings may be used. For example, a plurality of separate wafer gratings may be provided on the wafer. The plurality of wafer gratings may for example be provided as an array which extends across the surface of the wafer.

Although described embodiments of the invention have used either two illumination mode poles or four illumination mode poles, other numbers of illumination mode poles may be used.

A single illumination mode pole could be used. However, where this is the case movement of the wafer two directions is needed in order to obtain position measurement, a first direction being substantially in the plane of the wafer (in the XY plane) and a second direction being substantially perpendicular to the plane of the wafer (in the Z-direction).

Where two illumination mode poles are used, two detectors may be used, the detectors being located either side of the mask grating (e.g. as shown in FIG. 5). Where this is the case, movement of the wafer in the direction of detector separation will provide position measurements in that direction (and in the Z-direction) as is described above. In an alternative arrangement the detectors may be located such that a first detector provides position measurements for movement in a first direction (e.g. the X-direction) and a second provides position measurements for movement in a perpendicular direction (e.g. the Y-direction). Where this is the case movement in the X-direction together with movement in the Z-direction is required in order to obtain a position measurement using the first detector. Similarly, movement in the Y-direction together with movement in the Z-direction is required in order to obtain a position measurement using the second detector. For each direction a single illumination pole may be used.

Where three illumination poles are used three detectors may be provided, two on either side of the mask grating and the other separated from the mask grating in a perpendicular direction. For example, using X, Y, Z notation two detectors may be either side of the mask in the X-direction and the third detector may be separated from the mask in the Y-direction. Movement of the wafer in a direction which includes X and Y components will generate position measurements in the X, Y and Z directions.

Where four illumination poles and four detectors are used, the fourth pole and detector may provide some redundancy of measurement. For example, using X, Y, Z notation two detectors may be either side of the mask in the X-direction and two detectors may be either side of the mask in the Y-direction. The X-direction separated detectors provide position measurements in the X and Z directions. The Y-direction separated detectors provide position measurements in the Y and Z directions. Thus, Z-direction measurements are performed twice.

The intended meaning of the term 'diffraction order' in this document may be understood with reference to the diffraction grating equation below, which governs the positions of intensity maxima generated by a diffraction grating:

$$D(\text{Sin } \theta_m + \text{Sin } \theta_i) = m\lambda$$

where d is the grating period, i is the angle at which radiation is incident upon the grating, λ is the radiation wavelength and m is an integer which can be positive or negative. Each integer value corresponds with a different diffraction order.

Embodiments described above are generally concerned with calibration operations performed prior to, or between exposure of a wafer to a pattern on a mask. For example, it is described above that a calibration could be performed in advance of exposing wafers with a particular die (or target area) layout using a mask sensor apparatus MS. Generally, therefore, as depicted in FIG. 10, gratings are provided in a central portion of the mask sensor apparatus and across a wafer. In another embodiment, calibration measurements may be obtained during an exposure operation of the lithographic apparatus to expose the wafer to a pattern from a mask MA. As will be evident from the preceding and following description, the calibration measurements performed during an exposure operation may be used to calibrate both the position of the wafer W and other components such as the wafer table WT.

Figure 27:
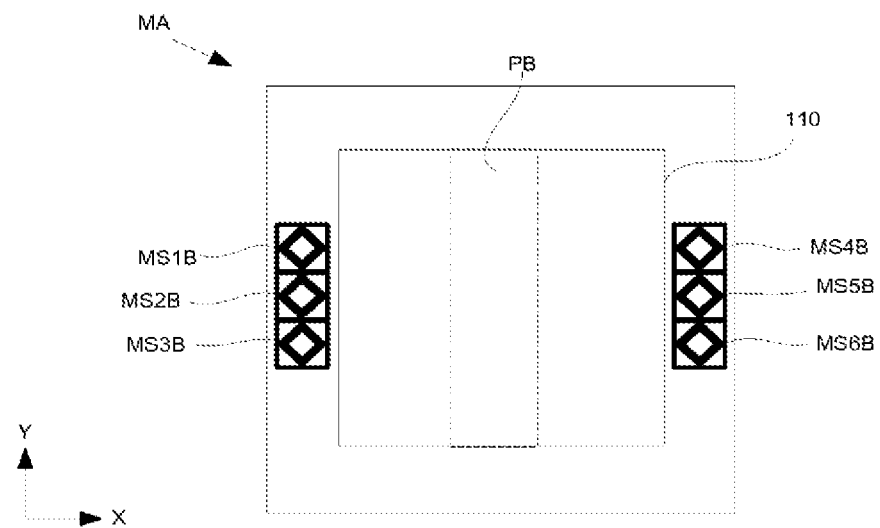
FIG. 27 schematically depicts a mask sensor arrangement in a further alternative embodiment of the invention.

Referring to FIG. 27, there is depicted a mask MA having a pattern 110 to be imparted to the radiation beam PB. The radiation beam PB is incident on the pattern 110 of the mask MA, which is held on the support structure MT. Having traversed the mask MA, the beam PB passes through the lens PL, which focuses the beam onto a target portion of the wafer W. The wafer table WT can be moved accurately, e.g. so as to position different target portions of the wafer in the path of the beam PB.

The lithographic apparatus may move the mask MA and the substrate W with a scanning motion when projecting the pattern from mask MA onto a target portion of the wafer W. In FIG. 1 the z-direction corresponds with an optical axis of the radiation beam PB. In an embodiment in which the lithographic apparatus is a scanning lithographic apparatus, the scanning motion is along the x-axis. In contemporary lithographic apparatus there are two directions in which the patterning device MA is scanned during exposure. The two scan directions may be referred to as scan-up and scan-down respectively as the scans typically take place in opposite directions along the same axis.

Figure 28:
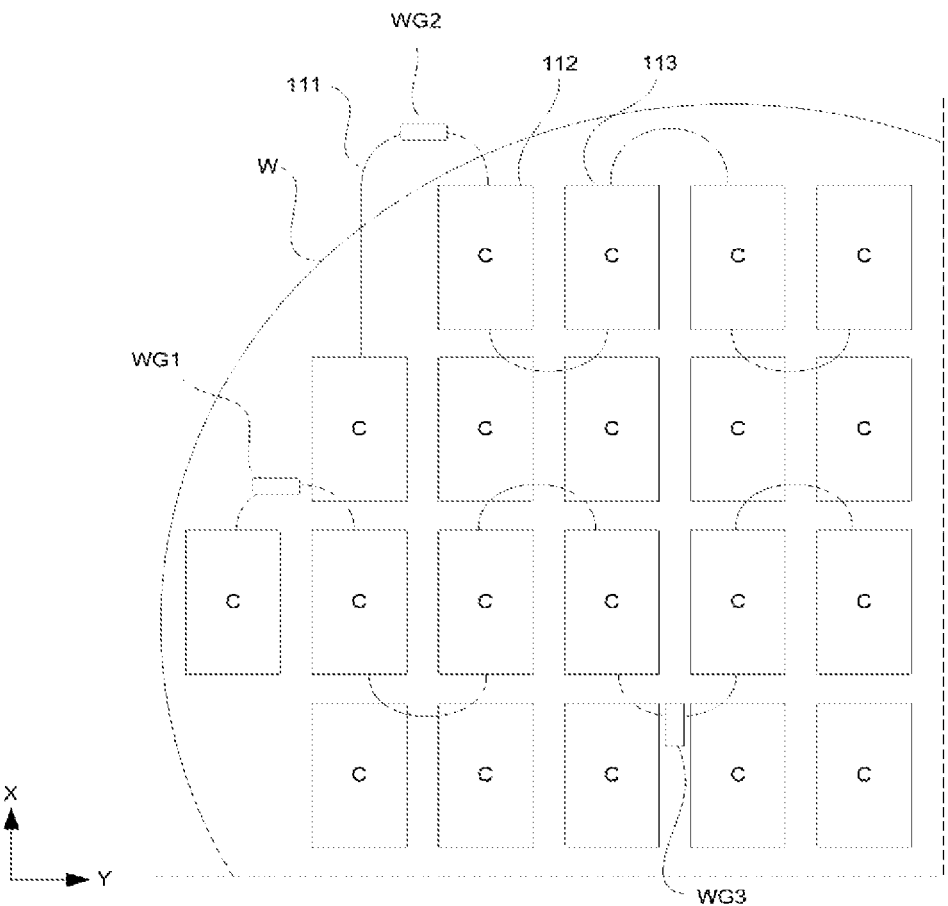
FIG. 28 schematically depicts example wafer diffraction grating placement in an embodiment of the invention.

FIG. 28 schematically illustrates an example of a wafer in accordance with an embodiment for use with in-scan calibration measurements. The wafer W comprises a plurality of target portions labelled C. An exposure route 111 is depicted, although it will be appreciated that other exposure routs may be used (such as shown in FIG. 12, for example). To expose one of the target portions C to the pattern 110, the wafer table WT is moved to scan the wafer W in time with the scanning movement of the mask MA.

During exposure of a target portion of a wafer, the support structure MT is moved to scan the pattern 110 through the radiation beam PB. The wafer table WT is scanned simultaneously so as to expose an entire target portion C to the pattern provided on the patterned region 110. After exposure of a target portion C, the wafer table WT is moved to position the wafer W for the next exposure. For example, where the target portion 112 of FIG. 28 is the most recent target portion to be exposed (in what may be a "scan-down" operation), the wafer table WT follows the exposure route 111 to position the wafer W for the exposure of the next target portion 113 (in what may be a "scan-up" operation).

In an embodiment, wafer gratings may be provided along or near to the exposure route 111 such that calibration measurements may be taken during exposure of a wafer. In particular, wafer diffraction gratings WG may be provided on the wafer and/or outside the wafer, e.g. on the wafer table WT. In the example of FIG. 28, a first wafer diffraction grating array is WG1 is provided along the exposure route 111 at a corner position of the wafer W in which a target portion C is not provided (e.g. due to the circular geometry of the wafer W). A second wafer diffraction grating WG2 is provided along the exposure route 111 outside the wafer W, while a third wafer diffraction grating WG3 is provided along the exposure route 111 in a scribe lane between two target portions.

It will be appreciated that the flexibility of positioning of the wafer gratings is such that alignment calibration may be performed at any or all of multiple points during an exposure sequence. For example, where wafer gratings are placed on the wafer table WT (e.g., not on the wafer W itself), alignment calibration may be performed at the very beginning of the exposure sequence, before exposure of any of the target portions C has occurred. Where desired, alignment may continue at points during the exposure sequence.

Referring again to FIG. 27, it was described above that to pattern each target portion C, the mask patterned region 110 is scanned through the radiation beam PB. A plurality of mask sensor apparatuses MS1B-MS6B are provided outside of the patterned region 110. In the depicted example embodiment, three mask sensor apparatuses MS1B-MS3B are provided on a left-hand side of the mask MA and three mask sensor apparatuses MS4B-MS6B are provided on a right-hand side of the mask MA. After scanning the patterned region 110 through the radiation beam, the mask support structure MT is configured to continue to scan the mask MA beyond the patterned region 110 so that the radiation beam PB is incident on one side's mask sensor apparatuses. In this way, three sensor apparatuses are used following each scan-up and scan-down operation.

Figure 29:
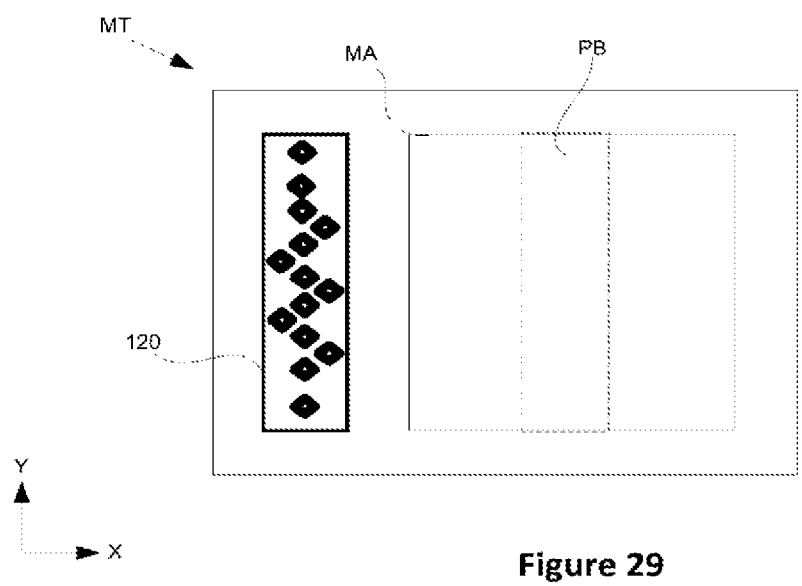
FIG. 29 schematically depicts an alternative mask sensor arrangement.

In other embodiments, mask sensor apparatuses may be provided separately to the mask MA, e.g. on the support structure MT. FIG. 29 depicts an alternative arrangement in which a plurality of mask sensor apparatuses are provided in an area 120 adjacent the mask MA on the support structure MT. Provision of the mask sensor apparatuses 120 on the support structure MT may provide greater freedom and cost effectiveness than placement of mask sensor apparatuses directly on the mask MA. Additionally, the area 120 may be arranged such that the complete exposure area of the radiation beam PB is utilised, thereby allowing more mask sensor apparatuses to be used and in different configurations.

To reduce the impact of calibration measurements on throughput of the lithographic apparatus, the mask sensor apparatuses may be placed at the turning point (in the x-dimension) of the support structure MT.

In other embodiments, the mask MA may not be a scanning system. That is, the lithographic apparatus may be arranged such that the entire patterned region 110 is within the extent of the radiation beam PB. In this case, following the patterning of a target region C, the support structure MT may be arranged to move the mask MA to place one or more mask sensor apparatuses in the path of propagation of the radiation beam PB.

As described above, the illuminator IL may comprise adjusting means for selecting an illumination mode of the radiation beam PB such as a dipole mode, a quadrupole mode, or other mode for use with the mask sensor apparatuses. Where the calibration measurements are taken during an exposure sequence of a wafer W, the adjusting means may be operable to change the illumination mode of the radiation beam PB after patterning a target region C of the wafer W and before performing a calibration measurement. The adjusting means may then return the illumination mode required for patterning the next target region C.

In each of the examples of FIG. 28, the placement of the wafer diffraction gratings WG1-WG3 is such that obtaining calibration measurements may be considered to be "throughput neutral". That is, as the wafer diffraction gratings WG1-WG3 are positioned exactly along the exposure route, at points during which none of the target regions C are being patterned, the calibration measurements may be taken without impacting the throughput of the lithographic apparatus. It will be appreciated, however, that where it is not possible to provide a wafer grating WG exactly along the exposure route 111, a wafer grating WG may be provided adjacent the exposure route 111 such that any impact on throughput is significantly reduced. Generally therefore, it is to be understood that wafer gratings WG may be placed on or near to the exposure route 111 outside of the target portions C.

It will be appreciated from the above that calibration measurements taken as part of an exposure sequence may use any individual embodiment or combination of embodiments described above.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The lithographic apparatus may be of a type wherein the wafer is immersed in a liquid having a relatively high refractive index, e.g. water, so as to fill a space between the final element of the projection system and the wafer. Immersion techniques are well known in the art for increasing the numerical aperture of projection systems.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum.

Although embodiments of the invention have been described in the context of a transmissive lithographic apparatus, the invention may also be used in a reflective lithographic apparatus (e.g. an EUV lithographic apparatus). Where this is the case, due to the reflective nature of the lithographic apparatus a radiation beam from an illumination system of the lithographic apparatus may be directed towards a mask at an angle (i.e. not perpendicular to the mask). This angle of incidence is known and does not change. Therefore, detectors and associated filters may be configured such that their measurements are not affected by the angle. For example, a detector (and associated filter) which is aligned with the direction of incidence of the radiation beam may be removed. This leaves behind three detectors and associated filters, which may for example be used in the manner described above for three illumination poles.

Although embodiments of the invention have been described in the context of a lithographic apparatus, embodiments of the invention may be used in other apparatus. Embodiments of the invention may form part of a mask inspection apparatus, a metrology apparatus, or any apparatus that measures an object such as a wafer (or other substrate) or mask (or other patterning device). These apparatus may be generally referred to as lithographic tools. In the context of such apparatus, projection optics of the tool may be considered to be equivalent to a projection system. The grating used to diffract the illumination mode poles may be provided on any suitable surface on a first side of the projection optics. An object (e.g. a wafer or a mask) may be provided be held by a support structure on an opposite side of the projection optics.

While specific embodiments of the invention have been described above, it will be appreciated that the invention may be practiced otherwise than as described. The description is not intended to limit the invention.

The invention claimed is:

1. A method for exposing a wafer in a lithographic apparatus comprising:
   executing at least one calibration measurement during an exposure sequence of a wafer, each calibration measurement comprising:

using at least one radiation pole to illuminate a diffraction grating on at least one of a support structure supporting a mask at a mask side of a projection system and a mask of the lithographic apparatus, coupling at least two different resulting diffraction orders per illumination pole through the projection system, using the projection system to project the diffraction orders onto an object grating on or adjacent an exposure route of a wafer such that a pair of combination diffraction orders is formed by diffraction of the diffraction orders, coupling the combination diffraction orders back through the projection system to a detector system configured to measure an intensity of the combination diffraction orders; and using the measured intensity of the combination diffraction orders to measure a position of the object grating; and adjusting an illumination mode of the radiation beam prior to executing at least one calibration measurement.

2. The method of claim 1, further comprising adjusting responsive to at least one calibration measurement at least one of the exposure route of the wafer and the support structure prior to exposing a target portion of the wafer.

3. The method of claim 2, wherein at least one calibration measurement is executed at the beginning of an exposure sequence prior to exposure of any target portions of the wafer.

4. The method of claim 2, wherein the object grating is positioned on the wafer table outside the wafer.

5. The method of claim 2, wherein the object grating is positioned on the wafer.

6. The method of claim 1, wherein at least one calibration measurement is executed at the beginning of an exposure sequence prior to exposure of any target portions of the wafer.

7. The method of claim 6, wherein the object grating is positioned on the wafer table outside the wafer.

8. The method of claim 6, wherein the object grating is positioned on the wafer.

9. The method of claim 8, wherein the object grating is positioned in a scribe lane between target portions of the wafer.

10. The method of claim 1, wherein the object grating is positioned on the wafer table outside the wafer.

11. The method of claim 1, wherein at least one calibration measurement is executed following exposure of a target portion of the wafer and prior to exposure of a next exposure sequence.

12. The method of claim 1, wherein the object grating is positioned on the wafer.

13. The method of claim 12, wherein the object grating is positioned in a scribe lane between target portions of the wafer.

14. The method of claim 13, wherein a further object grating is positioned on the wafer table outside the wafer.

15. The method of claim 12, wherein a further object grating is positioned on the wafer table outside the wafer.

16. The method of claim 1, the method further comprising:

exposing a first target portion of the wafer with a radiation beam having a first illumination mode;

adjusting the illumination mode of the radiation beam to provide the multiple radiation poles and performing at least one calibration measurement with the adjusted illumination mode.

17. The method of claim 1, further comprising moving the support structure to move the radiation beam from the mask to the diffraction grating on the support structure.

18. The method of claim 1, wherein the mask side diffraction grating is two-dimensional.

19. The method of claim 1, wherein the object grating is two-dimensional and extends across substantially an entire wafer.

* * * * *